United States Patent
Utsumi et al.

(10) Patent No.: US 11,430,870 B2
(45) Date of Patent: Aug. 30, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Makoto Utsumi, Matsumoto (JP); Yasuyuki Kawada, Tsukuba (JP); Aki Takigawa, Hachioji (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 105 days.

(21) Appl. No.: 17/085,947

(22) Filed: Oct. 30, 2020

(65) Prior Publication Data

US 2021/0134961 A1    May 6, 2021

(30) Foreign Application Priority Data

Nov. 6, 2019 (JP) .............................. JP2019-201781

(51) Int. Cl.
*H01L 29/16* (2006.01)
*H01L 21/04* (2006.01)
*H01L 21/3065* (2006.01)

(52) U.S. Cl.
CPC ........ *H01L 29/1608* (2013.01); *H01L 21/049* (2013.01); *H01L 21/3065* (2013.01)

(58) Field of Classification Search
None
See application file for complete search history.

(56) References Cited

U.S. PATENT DOCUMENTS

2015/0214354 A1    7/2015 Nakano et al.
2016/0087045 A1    3/2016 Shimizu
(Continued)

FOREIGN PATENT DOCUMENTS

JP    2005056868 A    3/2005
JP    2016063111 A    4/2016
(Continued)

OTHER PUBLICATIONS

Office Action of Japanese Patent Application 2019-201781 dated Mar. 27, 2020. (Machine translation provided).

*Primary Examiner* — Jack S Chen
(74) *Attorney, Agent, or Firm* — Rabin & Berdo, P.C.

(57) ABSTRACT

After trench etching, trench corner portions are rounded by hydrogen annealing at a temperature of at least 1500 degrees C. Next, n-type regions that cause leak current and are formed in inner walls of the trenches by the hydrogen annealing are removed by a heat treatment (hydrogen etching) under a hydrogen atmosphere of a temperature less than 1500 degrees C. and the inner walls are planarized. Next, the inner walls are nitrided by introducing nitrogen into the heat treatment furnace while the temperature of the hydrogen-etching heat treatment decreases, thereby forming a SiN film along the inner walls. Next, an HTO film is formed, as gate insulating films, on the SiN film along the inner walls of the trenches. Thereafter, by PDA, an oxygen amount of an interface section of a $SiO_2$/SiC interface is set to be at most $1.6 \times 10^{15}/cm^2$ and a nitrogen amount is set to more than $5.0 \times 10^{14}/cm^2$.

11 Claims, 21 Drawing Sheets

(56) References Cited

U.S. PATENT DOCUMENTS

| | | | |
|---|---|---|---|
| 2019/0035882 A1 | 1/2019 | Takeuchi et al. | |
| 2020/0027716 A1 | 1/2020 | Komatsu | |
| 2020/0343345 A1* | 10/2020 | Utsumi | H01L 29/0623 |
| 2021/0134961 A1* | 5/2021 | Utsumi | H01L 29/1095 |

FOREIGN PATENT DOCUMENTS

| | | |
|---|---|---|
| JP | 2017152490 A | 8/2017 |
| JP | 2019121676 A | 7/2019 |
| WO | 2014027662 A1 | 2/2014 |
| WO | 2018054597 A1 | 3/2018 |

* cited by examiner

HAADF IMAGE

ABF IMAGE

HAADF IMAGE

ABF IMAGE

HAADF IMAGE

ABF IMAGE

FIG.18

| ATMOSPHERE | PDA TEMPERATURE (°C) | TREATMENT TIME (min) | OXYGEN (O) AMOUNT[/cm²] | NITROGEN (N) AMOUNT[/cm²] | CHANNEL MOBILITY |
|---|---|---|---|---|---|
| NO PDA | — | — | $1.6 \times 10^{15}$ | $5.3 \times 10^{13}$ | × |
| 100%N$_2$ | 1100 | 30 | $1.6 \times 10^{15}$ | $2.7 \times 10^{14}$ | × |
| 100%N$_2$ | 1200 | 30 | $1.7 \times 10^{15}$ | $2.8 \times 10^{14}$ | × |
| 90%N$_2$+10%NO | 1100 | 30 | $1.4 \times 10^{15}$ | $4.9 \times 10^{14}$ | × |
| 90%N$_2$+10%NO | 1150 | 30 | $1.4 \times 10^{15}$ | $5.7 \times 10^{14}$ | △ |
| 90%N$_2$+10%NO | 1200 | 30 | $1.3 \times 10^{15}$ | $6.4 \times 10^{14}$ | ○ |
| 90%N$_2$+10%NO | 1300 | 10 | $1.4 \times 10^{15}$ | $5.5 \times 10^{14}$ | ◎ |
| 90%N$_2$+10%NO | 1300 | 30 | $1.6 \times 10^{15}$ | $5.2 \times 10^{14}$ | ○ |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-201781, filed on Nov. 6, 2019, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, for vertical metal oxide semiconductor field effect transistors (MOSFETs) that use silicon carbide (SiC) as a semiconductor material, have a trench gate structure, and include insulated gates having a three-layered structure including a metal, an oxide film, and a semiconductor, it is known that a heat treatment under a hydrogen ($H_2$) atmosphere (hereinafter, hydrogen annealing) is performed to round corner portions (corners) of trenches after formation of the trenches.

A method of manufacturing a conventional silicon carbide semiconductor device will be described. FIG. 19 is a flowchart of an outline of the method of manufacturing the conventional silicon carbide semiconductor device. FIG. 20 is a characteristics diagram of results of simulation of electron current density distribution near a channel (n-type inversion layer) of the conventional silicon carbide semiconductor device. FIG. 21 is a characteristics diagram of element detection ratios near the channel depicted in FIG. 20. In FIG. 21, element detection ratios of a channel 103a portion of an interface (hereinafter, $SiO_2$/SiC interface) between a gate insulating film 107 and silicon carbide portion of an inner wall of a trench 106 depicted in FIG. 20 are shown.

In forming MOS gates of a conventional silicon carbide semiconductor device 110, first, an oxide film (not depicted) is formed on a front surface of a semiconductor substrate containing silicon carbide and portions of the oxide film corresponding to formation regions of the trenches 106 are removed. Next, etching (hereinafter, trench etching) is performed using the remaining portions of the oxide film as a mask (mask oxide film) to, thereby, form the trenches 106 that reach a predetermined depth from the front surface of the semiconductor substrate (step S101). Next, the mask oxide film used to form the trenches 106 is removed.

The semiconductor substrate is formed by sequentially stacking epitaxial layers forming an $n^-$-type drift region 102 and a p-type base region 103 on a front surface of an $n^+$-type starting substrate forming an $n^+$-type drain region (not depicted) and containing silicon carbide as a semiconductor material. The semiconductor substrate has a main surface that is a surface of a p-type epitaxial layer forming the p-type base region 103 and regarded as a front surface of the semiconductor substrate; the semiconductor substrate has another main surface that is a back surface of the $n^+$-type starting substrate and regarded as a back surface of the semiconductor substrate. In the process at step S101, the trenches 106 penetrate the p-type base region 103 from the front surface of the semiconductor substrate and reach the $n^-$-type drift region 102.

Next, by hydrogen annealing under a hydrogen atmosphere of a pressure of about 11 kPa and a temperature of at least about 1500 degrees C. for about 15 minutes, corner portions of the trenches 106 are rounded (step S102). In the process at step S102, etching of inner walls of the trenches 106 and surface diffusion of a silicon (Si) element and a carbon (C) element of the inner walls of the trenches 106 occur concurrently, whereby the corner portions of the trenches 106 are rounded and surface regions of the inner walls of the trenches 106 become n-type regions. The n-type regions are places where leak current occurs during reverse bias of the silicon carbide semiconductor device 110.

Thus, the trench inner walls are thermally oxidized (dry oxidation), thereby forming an oxide film (not depicted) (step S103). Next, a field oxide film (not depicted) is deposited on an entire area of the front surface of the semiconductor substrate (step S104). The field oxide film, for example, is a tetraethoxysilane (TEOS) film formed by plasma-enhanced chemical vapor deposition (plasma CVD).

Next, by photolithography and etching, the field oxide film and the oxide film formed at step S103 are selectively removed, thereby exposing a portion of the front surface of the semiconductor substrate corresponding to an active region (step S105). By the process at step S105, the portion of the front surface of the semiconductor substrate corresponding to the active region is exposed, whereby the inner walls of the trenches 106 are also exposed. Next, along the inner walls of the trenches 106, for example, high temperature oxide (HTO) film is deposited as the gate insulating film 107 (step S106).

Next, post deposition annealing (PDA), for example, is performed at a temperature of about 1100 degrees C. for about 30 minutes under a nitrogen ($N_2$) atmosphere diluted by about 10% nitric oxide (NO) (step S107), whereby characteristics of an interface ($SiO_2$/SiC interface) 114 between the gate insulating film 107 and silicon carbide portions of the inner walls of the trenches 106 are improved. Next, on the front surface of the semiconductor substrate, a polysilicon (poly-Si) layer doped with an n-type impurity is deposited and the polysilicon layer is embedded in the trenches 106.

Next, the polysilicon layer is etched to leave portions thereof only in the trenches 106 to become gate electrodes 108 (step S108). The MOS gates are configured by the trenches 106, the gate insulating film 107, and the gate electrodes 108 formed by the processes at steps S101 to S108. Reference numeral 104 is an $n^+$-type source region. In FIG. 19, while only formation processes for the MOS gates are depicted, portions other than the MOS gates are formed at predetermined timings by general methods, whereby the conventional silicon carbide semiconductor device 110 is completed.

As a method of forming the MOS gates of the conventional silicon carbide semiconductor device, a method has been proposed according to which trenches that become MOS gates are formed and thereafter, as needed, inner walls of the trenches are etched by a heat treatment under a hydrogen atmosphere (hereinafter, hydrogen etching), whereby corner portions of the trenches are rounded (for example, refer to Japanese Laid-Open Patent Publication No. 2017-152490 (paragraph 0046)). In Japanese Laid-Open Patent Publication No. 2017-152490, by hydrogen etching under a reduced pressure of at least 1600 degrees, corner portions of the trenches are rounded and a damage layer occurring at the inner walls of the trenches during trench etching is removed.

SUMMARY OF THE INVENTION

According to an embodiment of the invention, a silicon carbide semiconductor device includes a semiconductor substrate containing silicon carbide and having a first main surface and a second main surface opposite to one another; a first semiconductor region of a first conductivity type, provided in the semiconductor substrate; a plurality of second semiconductor regions of a second conductivity type, provided between the first main surface of the semiconductor substrate and the first semiconductor region; a plurality of third semiconductor regions of the first conductivity type, provided between the first main surface of the semiconductor substrate and the second semiconductor regions; a plurality of trenches penetrating the third semiconductor regions and the second semiconductor regions and reaching the first semiconductor region; a plurality of gate insulating films provided along inner walls of the trenches; a plurality of gate electrodes provided on the gate insulating films on the inner walls of the trenches; a first electrode electrically connected to the third semiconductor regions and the second semiconductor regions; and a second electrode provided on the second main surface of the semiconductor substrate. Each interface between one of the gate insulating films and a corresponding one of the second semiconductor regions has an interface section in which an oxygen concentration varies, the interface section having an oxygen amount that is in a range from $1.3 \times 10^{15}/cm^2$ to $1.6 \times 10^{15}/cm^2$. The interface section has a nitrogen amount that is greater than $5.0 \times 10^{14}/cm^2$.

In the embodiment, the interface section has a width that is at most 1.6 nm.

According to another embodiment of the invention, a method of manufacturing a silicon carbide semiconductor device, includes preparing a starting substrate of a first conductivity type and containing silicon carbide; forming a first-conductivity-type silicon carbide layer on the starting substrate, the first-conductivity-type silicon carbide layer having an impurity concentration lower than an impurity concentration of the starting substrate, the first-conductivity-type silicon carbide layer constituting a first semiconductor region of the first conductivity type; forming a second-conductivity-type silicon carbide layer on the first-conductivity-type silicon carbide layer, the second-conductivity-type silicon carbide layer constituting a plurality of second semiconductor regions of a second conductivity type; selectively forming a plurality of third semiconductor regions of the first conductivity type, in surface regions of the second-conductivity-type silicon carbide layer; forming a plurality of trenches that penetrate the third semiconductor regions and the second semiconductor regions and reach the first semiconductor region; planarizing inner walls of the trenches and exposing silicon carbide surfaces having an orderly crystal structure by etching the inner walls of the trenches; forming a thin film containing silicon, along the planarized inner walls of the trenches; depositing an oxide film on the thin film along the inner walls of the trenches, the oxide film constituting a plurality of gate insulating films; improving interface characteristics between the gate insulating films and silicon carbide portions of the inner walls of the trenches by performing a post deposition annealing treatment under an atmosphere containing nitric oxide and nitrogen; and forming a plurality of gate electrodes on the gate insulating films in the trenches. Each interface between one of the gate insulating films and a corresponding one of the second semiconductor regions has an interface section in which an oxygen concentration varies, an oxygen amount of the interface section being at most $1.6 \times 10^{15}/cm^2$. The thin film is formed by depositing a silicon nitride film or converting the thin film into a silicon nitride film at a predetermined timing, the interface section having a nitrogen amount greater than $5.0 \times 10^{14}/cm^2$. The method further includes, after forming the trenches but before etching the inner walls, rounding corner portions of the trenches by a first heat treatment under a hydrogen atmosphere of a temperature of at least 1500 degrees C. The inner walls of the trenches are etched and planarized by a second heat treatment under a hydrogen atmosphere of a temperature less than 1500 degrees C.

In the embodiment, rounding the corner portions, planarizing the inner walls, and forming the thin film are performed successively using a same first heat treatment furnace.

In the embodiment, the silicon nitride film is formed as the thin film by nitriding the silicon carbide surfaces of the inner walls of the trenches by introducing a gas containing nitrogen while the temperature of the second heat treatment decreases.

In the embodiment, the silicon nitride film is deposited as the thin film by introducing a silane gas and a nitrogen gas as a source gas into a second heat treatment furnace used in depositing the oxide film on the thin film.

In the embodiment, a silicon film is deposited as the thin film by introducing a silane gas as a source gas into a second heat treatment furnace used in depositing the oxide film on the thin film. The post deposition annealing treatment nitrides the thin film, converting the thin film into the silicon nitride film.

In the embodiment, in etching the inner walls of the trenches, the interface section has a width that is at most 1.6 nm.

In the embodiment, a temperature of the post deposition annealing treatment is in a range from 1100 degrees C. to 1300 degrees C.

In the embodiment, a treatment time of the post deposition annealing treatment is in a range from 10 minutes to 30 minutes.

According to another embodiment of the invention, a method of manufacturing a silicon carbide semiconductor device, includes preparing a starting substrate of a first conductivity type and containing silicon carbide; forming a first-conductivity-type silicon carbide layer on the starting substrate, the first-conductivity-type silicon carbide layer having an impurity concentration lower than an impurity concentration of the starting substrate, the first-conductivity-type silicon carbide layer constituting a first semiconductor region of the first conductivity type; forming a second-conductivity-type silicon carbide layer on the first-conductivity-type silicon carbide layer, the second-conductivity-type silicon carbide layer constituting a plurality of second semiconductor regions of a second conductivity type; selectively forming a plurality of third semiconductor regions of the first conductivity type, in surface regions of the second-conductivity-type silicon carbide layer; forming a plurality of trenches that penetrate the third semiconductor regions and the second semiconductor regions and reach the first semiconductor region; planarizing inner walls of the trenches and exposing silicon carbide surfaces having an orderly crystal structure by etching the inner walls of the trenches; forming a thin film containing silicon, along the planarized inner walls of the trenches; depositing an oxide film on the thin film along the inner walls of the trenches, the oxide film constituting a plurality of gate insulating films; improving interface characteristics between the gate insulating films and silicon carbide portions of the inner walls of the trenches by performing a post deposition annealing treatment under an atmosphere containing nitric oxide and nitrogen; and forming a plurality of gate electrodes on the gate insulating films in the trenches. The post deposition annealing treatment is performed at a temperature in a range from 1100 degrees C. to 1300 degrees C. for a treatment time in a range from 10 minutes to 30 minutes. The method further includes, after forming the trenches but before etching the inner walls of the trenches, rounding corner portions of the trenches by a first heat treatment under a hydrogen atmosphere of a temperature of at least 1500 degrees C. The inner walls of the trenches are etched and planarized by a second heat treatment under a hydrogen atmosphere of a temperature less than 1500 degrees C.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 18 is a table of an oxygen amount and a nitrogen amount of an interface section of an experimental example.

DETAILED DESCRIPTION OF THE INVENTION

Figure 19:
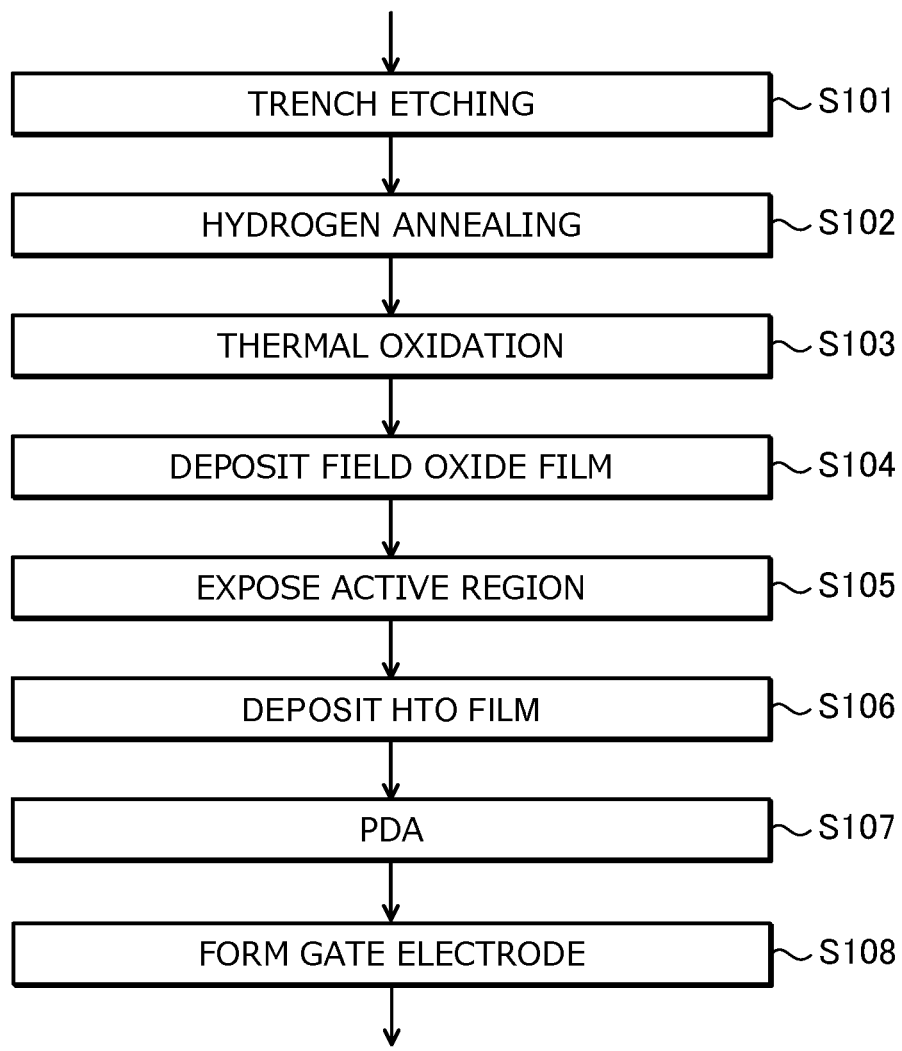
FIG. 19 is a flowchart of an outline of a method of manufacturing a conventional silicon carbide semiconductor device.
Figure 20:
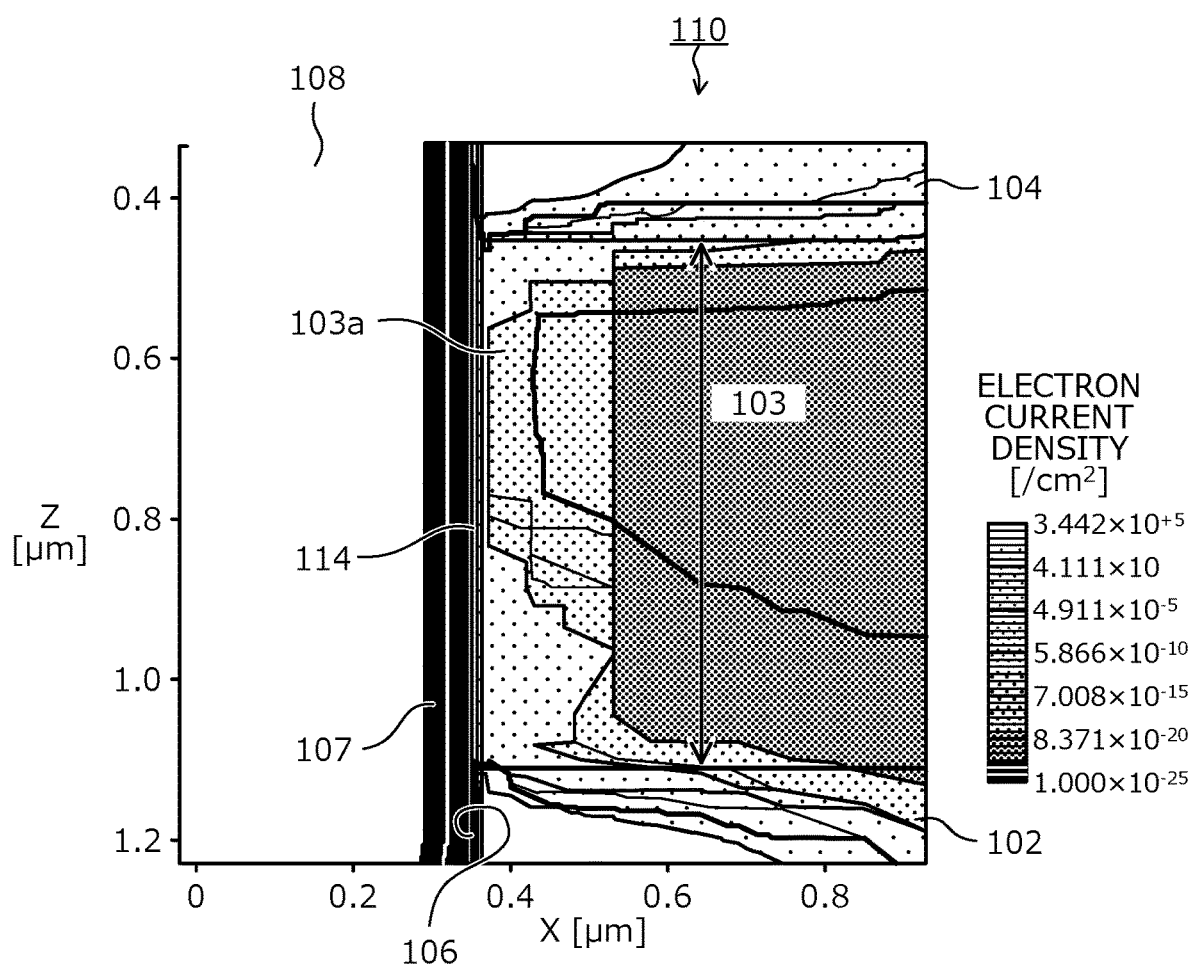
FIG. 20 is a characteristics diagram of results of simulation of electron current density distribution near a channel of the conventional silicon carbide semiconductor device.
Figure 21:
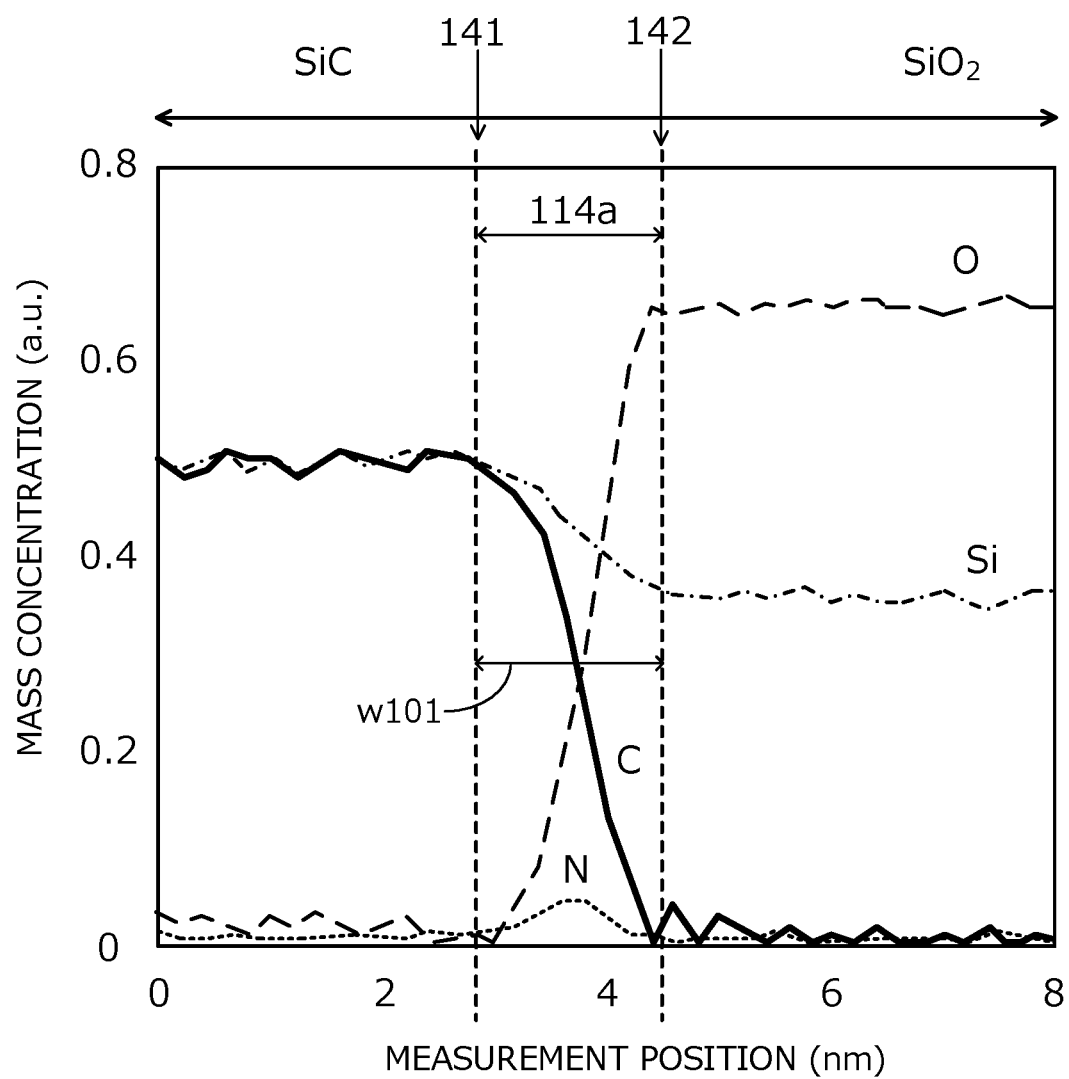
FIG. 21 is a characteristics diagram of element detection ratios near the channel depicted in FIG. 20.

First, problems associated with the conventional techniques will be discussed. When the inner walls of the trenches 106 are thermally oxidized (process at step S103) as in the method of manufacturing (refer to FIG. 19) the conventional silicon carbide semiconductor device 110 (refer to FIG. 20) described above, a problem arises in that channel resistance increases. The inventor confirmed that this problem is solved by performing hydrogen etching at a temperature lower than 1500 degrees C. instead of the thermal oxidation. Further, the inventor confirmed that there is room to reduce the channel resistance in a method of hydrogen etching the inner walls of the trenches 106 in this manner.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
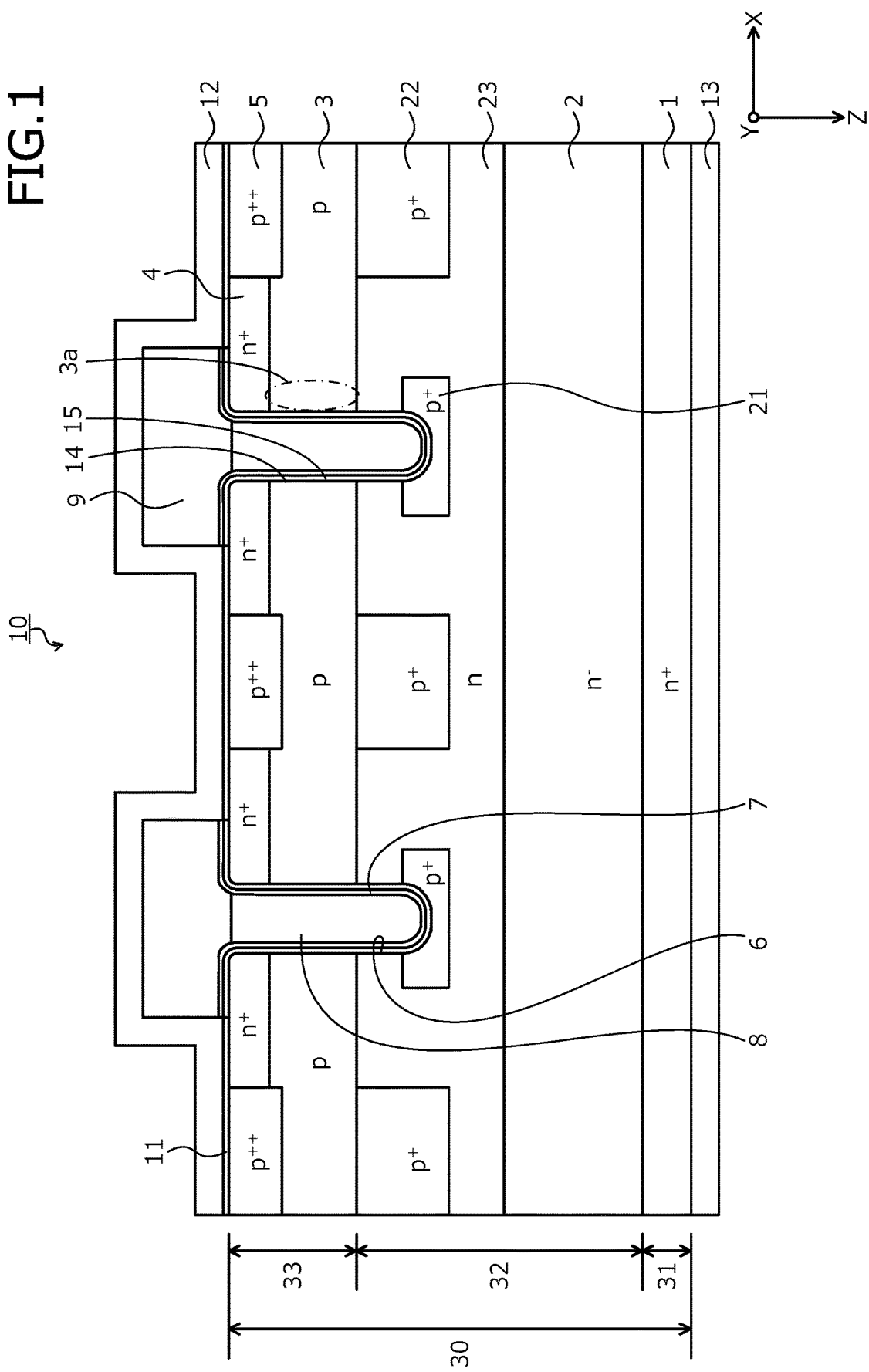
FIG. 1 is a cross-sectional view of a structure of a silicon carbide semiconductor device according to a first embodiment.

A structure of a silicon carbide semiconductor device according to a first embodiment will be described. FIG. 1 is a cross-sectional view of the structure of the silicon carbide semiconductor device according to the first embodiment. In FIG. 1, a cross-section of the structure in an active region is depicted while that in edge termination region is omitted (similarly in FIGS. 3 to 8). A silicon carbide semiconductor device 10 according to the first embodiment depicted in FIG. 1 is a vertical MOSFET having in the active region, a trench gate structure on a front side of a semiconductor substrate (semiconductor chip) 30 containing silicon carbide (SiC) as a semiconductor material. The active region is a region through which current passes when the MOSFET is in an ON state and in which multiple unit cells (configuration units of an element) of the MOSFET are disposed.

The edge termination region (not depicted) is a region between the active region and ends (chip ends) of the semiconductor substrate 30, the edge termination region surrounding a periphery of the active region, mitigating electric field of a front portion of the semiconductor substrate 30, and sustaining a breakdown voltage (withstand voltage). In the edge termination region, for example, a voltage withstanding structure such as a field limiting ring (FLR) or junction termination extension (JTE) structure is disposed. The breakdown voltage is a voltage limit at which no erroneous operation or destruction of an element occurs. A front surface of the semiconductor substrate in the edge termination region is covered by a field oxide film (not depicted) formed by a TEOS film, etc.

The semiconductor substrate 30 is an epitaxial substrate in which epitaxial layers (first-conductivity-type and second-conductivity-type silicon carbide layers) 32, 33 forming an n$^-$-type drift region (first semiconductor region) 2 and p-type base regions (second semiconductor regions) 3 are sequentially stacked on a front surface of the n$^+$-type starting substrate 31 containing silicon carbide as a semiconductor material. The semiconductor substrate 30 has a main surface that is a surface of the p-type epitaxial layer 33 and regarded as a front surface of the semiconductor substrate 30 and the semiconductor substrate 30 has another main surface that is a back surface of the n$^+$-type starting substrate 31 and regarded as a back surface of the semiconductor substrate 30. The n$^+$-type starting substrate 31 is an n$^+$-type drain region 1. The n$^-$-type drift region 2 is a portion of the n$^-$-type epitaxial layer 32 closest to the n$^+$-type starting substrate 31 and adjacent to the n$^+$-type starting substrate 31 in a depth direction Z.

The p-type base regions 3 are provided between the front surface of the semiconductor substrate 30 and the n$^-$-type drift region 2. An n-type current spreading region 23 is provided between adjacent to the p-type base regions 3 and the n$^-$-type drift region 2. The n-type current spreading region 23, for example, is a diffusion region formed by ion implantation in the n$^-$-type epitaxial layer 32. The n-type current spreading region 23 is a so-called current spreading layer (CSL) that reduces carrier spreading resistance. In the n-type current spreading region 23, p$^+$-type regions 21, 22 are each selectively provided separate from one another.

The p$^+$-type regions 21, 22 are electrically connected to a source electrode (first electrode) 12 described hereinafter and fixed at a source potential, the p$^+$-type regions 21, 22 having a function of depleting and mitigating electric field applied to bottoms of trenches 6 described hereinafter, when the MOSFET is in an OFF state. The p$^+$-type regions 21 are disposed at positions closer to the n$^+$-type drain region 1 than are interfaces between the p-type base regions 3 and the n-type current spreading region 23, to be separate from the p-type base regions 3 and respectively face the bottoms of the trenches 6 in the depth direction Z. The p$^+$-type regions 22 are provided between adjacent trenches 6 among the trenches 6, to be separate from the trenches 6 and the p$^+$-type regions 21, and in contact with the p-type base regions 3.

The n-type current spreading region 23 may be omitted. In an instance in which the n-type current spreading region 23 is omitted, the p-type base regions 3 and the n$^-$-type drift region 2 are adjacent to one another in the depth direction Z, and the p$^+$-type regions 21, 22 are each selectively provided in the n$^-$-type drift region 2. The trenches 6 penetrate the p-type epitaxial layer 33 from the front surface of the semiconductor substrate 30 in the depth direction Z, reach the n-type current spreading region 23, and terminate in the p$^+$-type regions 21. FIG. 1 depicts an instance in which the trenches 6 are formed in a linear shape along a second direction Y parallel to the front surface of the semiconductor substrate 30 and orthogonal to a first direction X.

Along inner walls of the trenches 6, for example, an oxide film such as a high temperature oxide (HTO) film, etc. is deposited as gate insulating films 7. In channel 3a portions described hereinafter of interfaces (SiO$_2$/SiC interfaces) 14 between the gate insulating films 7 and silicon carbide portions of inner walls of the trenches 6, an interface section 14a (refer to FIG. 15 described hereinafter) has a width w1 that is at most about 1.6 nm. The smaller is a ratio of the interface section 14a in the channel 3a, the more advantageous. The interface section 14a is a transition layer in which a carbon (C) concentration and an oxygen (O) concentration varies in the channel 3a portions of the SiO$_2$/SiC interfaces 14 and is a section from a start 41 of decrease of the carbon concentration to an end 42 of increase of the oxygen concentration.

An oxygen amount (areal density) of the interface section 14a, for example, is at most about $1.6\times10^{15}$/cm$^2$. A nitrogen (N) amount (areal density) of the interface section 14a, for example, is greater than $5.0\times10^{14}$/cm$^2$ and may be at least $5.5\times10^{14}$/cm$^2$. When the nitrogen amount of the interface section 14a is at least $5.5\times10^{14}$/cm$^2$, it is estimated that channel mobility improves due to the state in the interface section 14a decreasing.

In the trenches 6, gate electrodes 8 are provided on the gate insulating films 7 so as to be embedded in the trenches 6, respectively. The gate electrodes 8, for example, are a polysilicon (poly-Si) layer doped with an n-type impurity. The MOS gates are configured by the trenches 6, the gate insulating films 7, and the gate electrodes 8. Between adjacent trenches 6 among the trenches 6, n$^+$-type source regions (third semiconductor regions) 4 and p$^{++}$-type contact regions 5 are each selectively provided between the front surface of the semiconductor substrate 30 and the p-type base regions 3, in contact with the p-type base regions 3. The n$^+$-type source regions 4 and the p$^{++}$-type contact regions 5 are exposed at the front surface of the semiconductor substrate 30.

The n$^+$-type source regions 4 are provided closer to the trenches 6 than are the p$^{++}$-type contact regions 5. The n$^+$-type source regions 4 are in contact with the gate insulating films 7 at sidewalls of the trenches 6 and face the gate electrodes 8, across the gate insulating films 7. Portions of the p-type epitaxial layer 33 excluding the n$^+$-type source regions 4 and the p$^{++}$-type contact regions 5 are the p-type base regions 3. In portions of the p-type base regions 3 sandwiched between the n$^+$-type source regions 4 and the n$^-$-type drift region 2, the channel (n-type inversion layer) 3a is formed when the MOSFET is in the ON state. The p-type base regions 3 may be exposed at the front surface of the semiconductor substrate 30 without the p$^{++}$-type contact regions 5 being provided.

The trench gate structure is configured by the p-type base regions 3, the n$^+$-type source regions 4, the p$^{++}$-type contact regions 5, the trenches 6, the gate insulating films 7, and the gate electrodes 8. An interlayer insulating film 9 is provided on an entire area of the front surface of the semiconductor substrate 30 and covers the gate electrodes 8. In contact holes of the interlayer insulating film 9, metal electrodes (ohmic electrodes) 11 are provided on the front surface of the semiconductor substrate 30 in ohmic contact with the semiconductor substrate 30. The ohmic electrodes 11 are in ohmic contact with the $n^+$-type source regions 4 and the $p^{++}$-type contact regions 5, and are electrically connected to the p-type base regions 3, the $n^+$-type source regions 4, and the $p^{++}$-type contact regions 5.

In an instance in which the $p^{++}$-type contact regions 5 are not provided, the ohmic electrodes 11 are in ohmic contact with the p-type base regions 3 in the contact holes of the interlayer insulating film 9, instead of the $p^{++}$-type contact regions 5. The source electrode 12 is provided on the interlayer insulating film 9 so as to be embedded in the contact holes, the source electrode 12 being in contact with the ohmic electrodes 11 and electrically connected to the ohmic electrodes 11. A drain electrode (second electrode) 13 is provided on an entire area of the back surface of the semiconductor substrate 30 (back surface of the $n^+$-type starting substrate 31). The drain electrode 13 is in contact with the $n^+$-type drain region 1 (the $n^+$-type starting substrate 31) and electrically connected to the $n^+$-type drain region 1.

Figure 2:
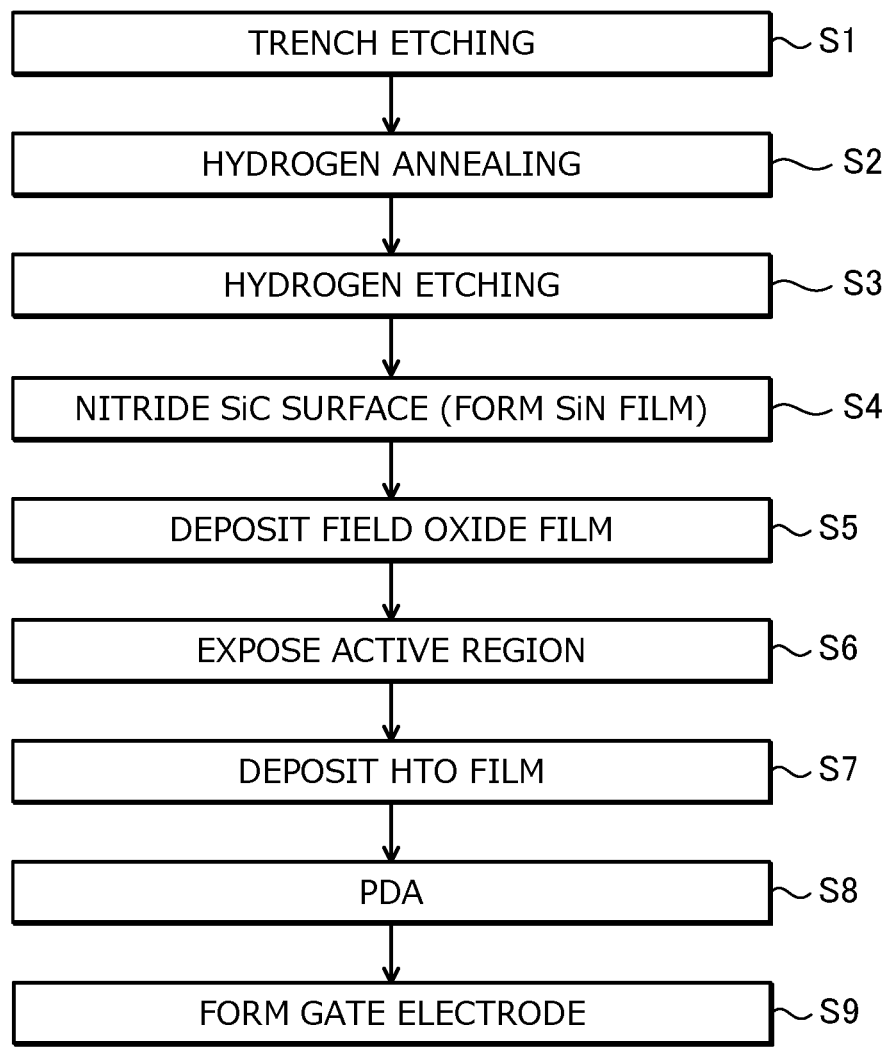
FIG. 2 is a flowchart of an outline of a method of manufacturing the silicon carbide semiconductor device according to the first embodiment.

Next, a method of manufacturing the silicon carbide semiconductor device 10 according to the first embodiment will be described. FIG. 2 is a flowchart of an outline of the method of manufacturing the silicon carbide semiconductor device according to the first embodiment. In FIG. 2, only formation processes (outline for states depicted in FIGS. 7, 8) of the MOS gates are depicted. FIGS. 3, 4, 5, 6, 7 and 8 are cross-sectional views of states of the silicon carbide semiconductor device according to the first embodiment during manufacture. Portions of the non-depicted edge termination region are formed at predetermined timings by general methods.

Figure 3:
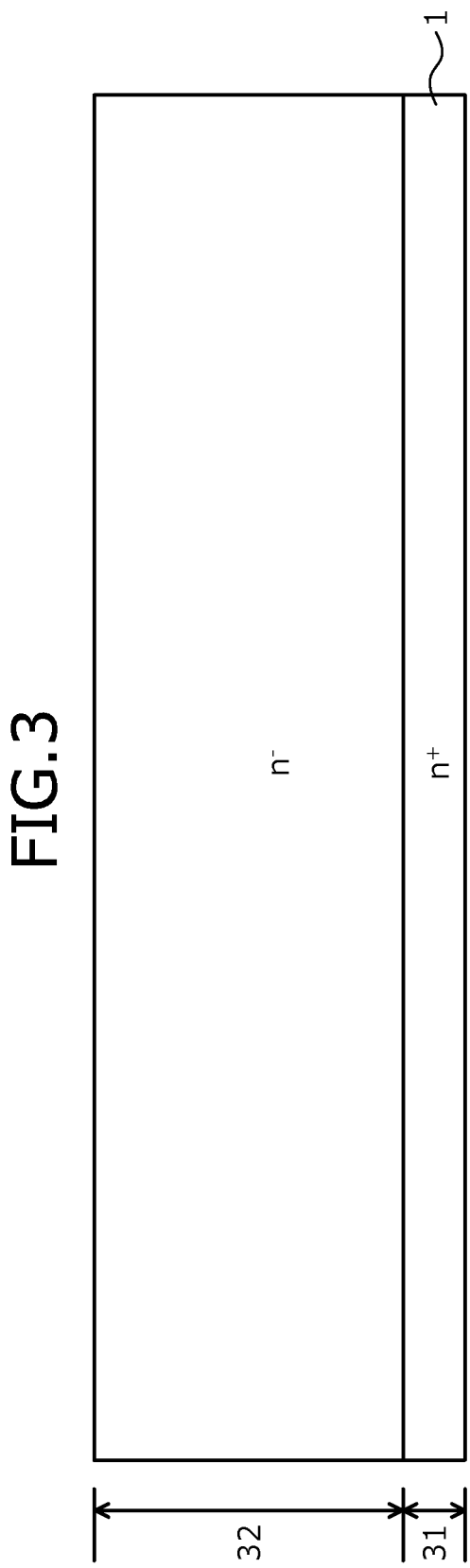
FIG. 3 is a cross-sectional view of a state of the silicon carbide semiconductor device according to the first embodiment during manufacture.
Figure 4:
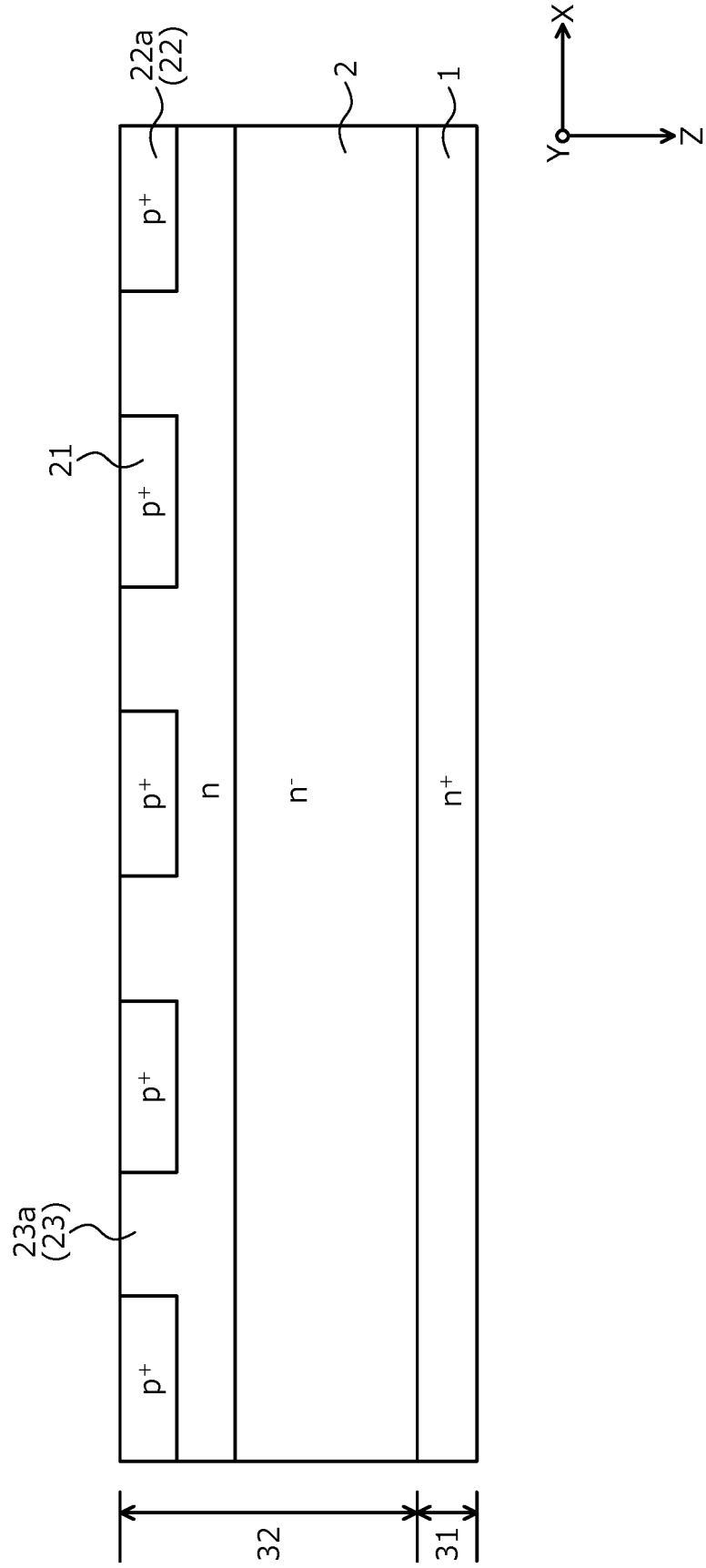
FIG. 4 is a cross-sectional view of a state of the silicon carbide semiconductor device according to the first embodiment during manufacture.

First, as depicted in FIG. 3, on the front surface of the $n^+$-type starting substrate 31 containing silicon carbide as a semiconductor material, the $n^-$-type epitaxial layer 32 is epitaxially grown (second process (step (2))). Next, as depicted in FIG. 4, by photolithography and ion implantation of a p-type impurity, the $p^+$-type regions 21, 22a are formed in surface regions of the $n^-$-type epitaxial layer 32, separate from and repeatedly alternating one another along the first direction X parallel to the front surface of the semiconductor substrate 30.

Next, by photolithography and ion implantation of an n-type impurity, in surface regions of the $n^-$-type epitaxial layer 32, n-type regions 23a are provided between and in contact with adjacent $p^+$-type regions 21, 22a among the $p^+$-type regions 21, 22a. A portion of the $n^-$-type epitaxial layer 32 between the $n^+$-type starting substrate 31 and the n-type regions 23a and the $p^+$-type regions 21, 22a is the $n^-$-type drift region 2.

Figure 5:
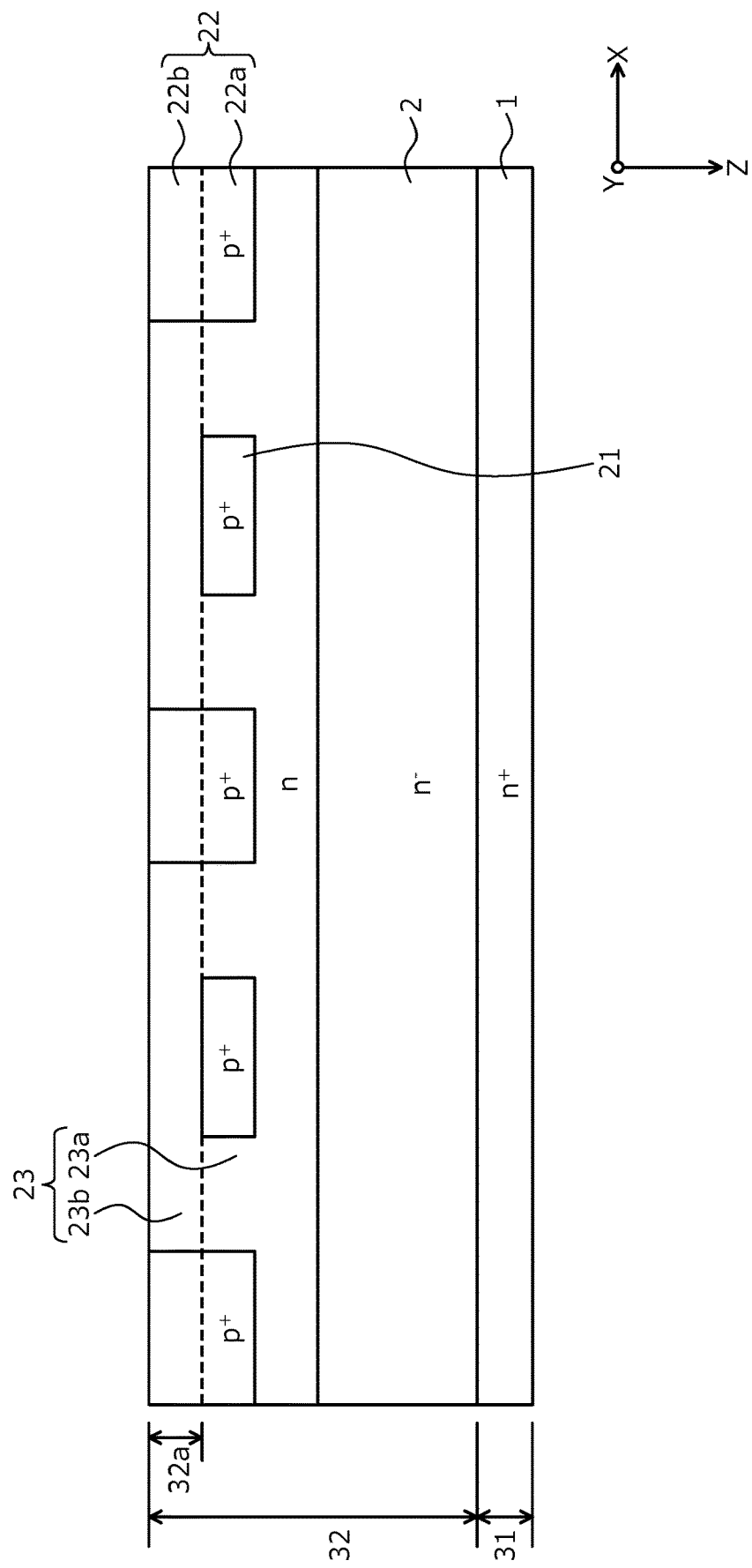
FIG. 5 is a cross-sectional view of a state of the silicon carbide semiconductor device according to the first embodiment during manufacture.

Next, as depicted in FIG. 5, the $n^-$-type epitaxial layer 32 is increased in thickness by epitaxial growth of a portion 32a. Next, by photolithography and ion implantation of a p-type impurity, $p^+$-type regions 22b are selectively formed in the portion 32a that increases the thickness of the $n^-$-type epitaxial layer 32, and among the $p^+$-type regions 22a and the $p^+$-type regions 22b, the $p^+$-type regions 22a and the $p^+$-type regions 22b adjacent to one another in the depth direction Z are connected, thereby forming the $p^+$-type regions 22.

Figure 6:
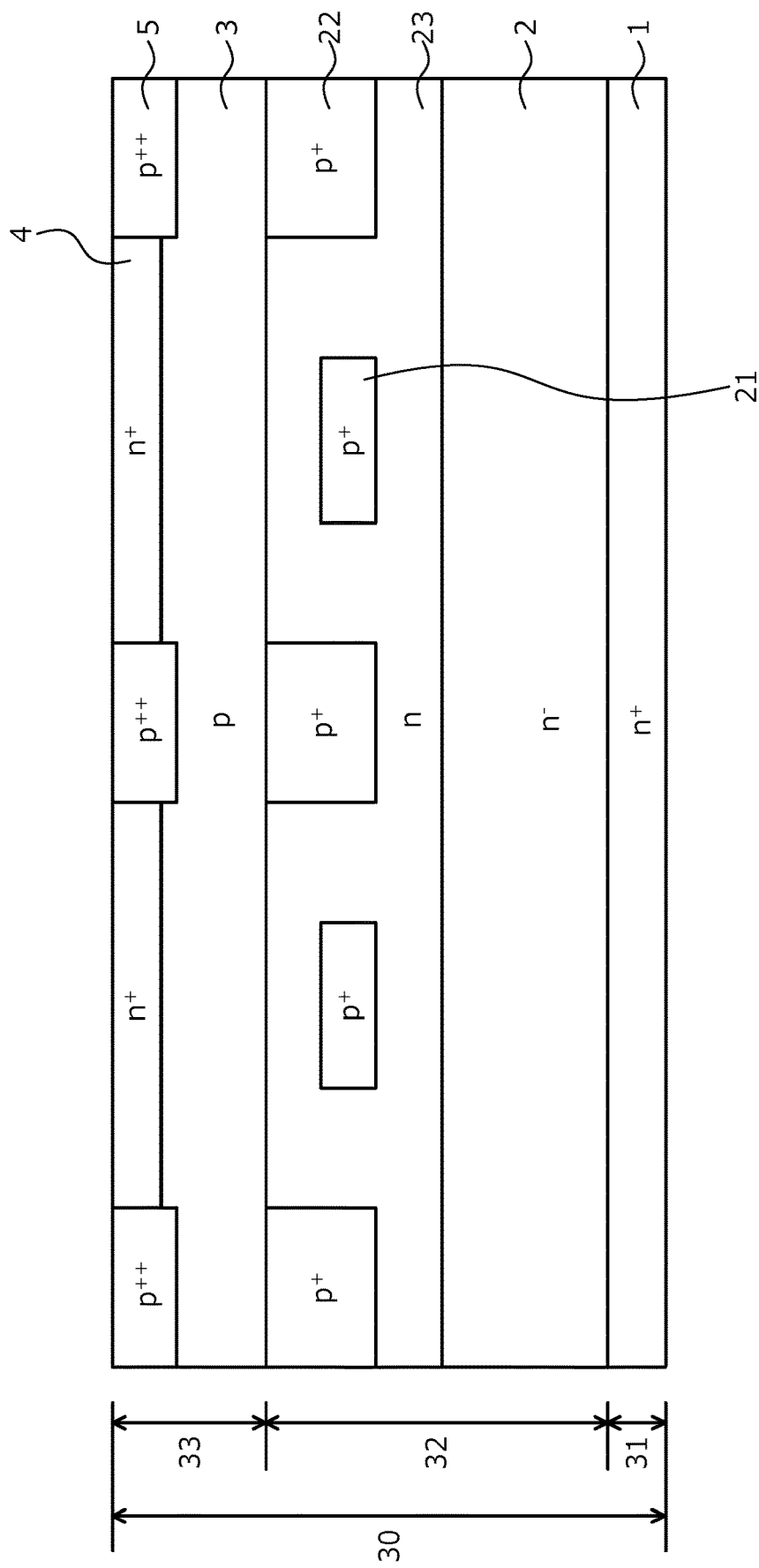
FIG. 6 is a cross-sectional view of a state of the silicon carbide semiconductor device according to the first embodiment during manufacture.

Next, by photolithography and ion implantation of an n-type impurity, in the portion 32a increasing the thickness of the $n^-$-type epitaxial layer 32, n-type regions 23b are formed and, among the n-type regions 23a and the n-type regions 23b, the n-type regions 23a and the n-type regions 23b adjacent to one another the depth direction Z are connected, thereby forming the n-type current spreading region 23. Next, as depicted in FIG. 6, the p-type epitaxial layer 33 is epitaxially grown on the $n^-$-type epitaxial layer 32, whereby the semiconductor substrate (semiconductor wafer) 30 is fabricated (third process (step (3))).

Next, a process including photolithography and ion implantation as one set is repeatedly performed under different conditions, whereby the $n^+$-type source regions 4 and the $p^{++}$-type contact regions 5 are each selectively formed in surface regions of the p-type epitaxial layer 33. The $p^{++}$-type contact regions 5 are disposed facing the $p^+$-type regions 22 in the depth direction Z. Portions between the $n^+$-type source regions 4, the $p^{++}$-type contact regions 5 and the $n^-$-type epitaxial layer 32 are the p-type base regions 3.

Next, for diffused regions (the $p^+$-type regions 21, 22, the n-type current spreading region 23, the $n^+$-type source regions 4, and the $p^{++}$-type contact regions 5) formed by ion implantation, a heat treatment for activating impurities is performed, for example, under an inert gas atmosphere of about 1700 degrees C. (fourth process (step (4))). The heat treatment for activating impurities may be performed once for all of the diffused regions collectively after formation thereof or the heat treatment may be performed each time diffusion regions are formed by ion implantation.

Figure 7:
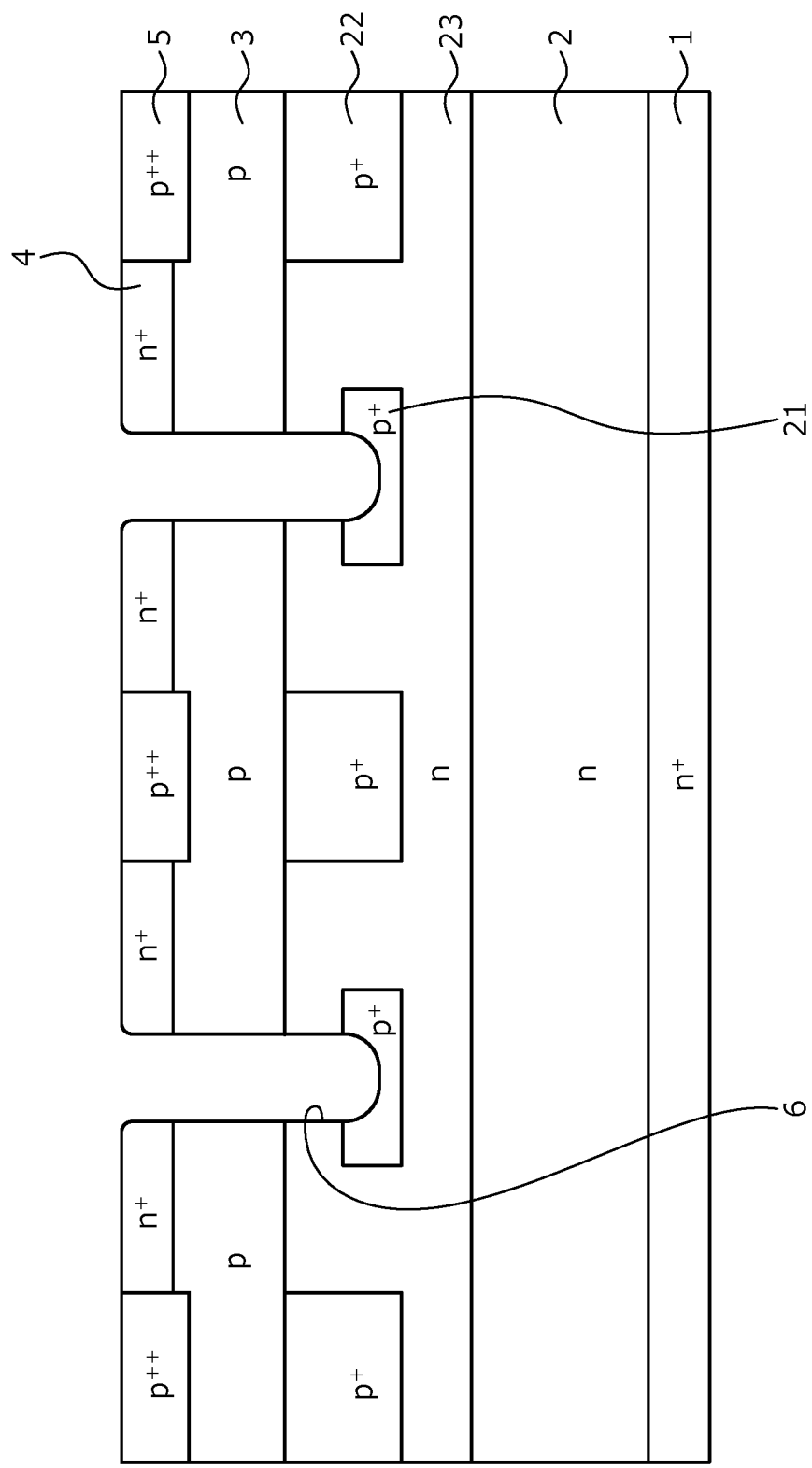
FIG. 7 is a cross-sectional view of a state of the silicon carbide semiconductor device according to the first embodiment during manufacture.

Next, as depicted in FIG. 7, an oxide film (not depicted) is formed on the front surface of the semiconductor substrate 30 and portions of the oxide film corresponding to formation regions of the trenches 6 are removed. Next, etching (trench etching) is performed using remaining portions of the oxide film as a mask (mask oxide film), whereby the trenches 6 are formed penetrating the $n^+$-type source regions 4 and the p-type base regions 3 from the front surface of the semiconductor substrate 30 to reach the $p^+$-type regions 21 (step S1: fifth process (step (5))). Subsequently, the mask oxide film for forming the trenches 6 is removed.

Next, the semiconductor substrate 30 is placed in a heat treatment furnace (first heat treatment). Subsequently, for example, a heat treatment is performed for about 15 minutes in the heat treatment furnace of a temperature of at least about 1500 degrees C., under a hydrogen ($H_2$) atmosphere of a pressure of about 11 kPa (hydrogen annealing: first heat treatment) (step S2: sixth process (step (6))). Etching of the inner walls of the trenches 6 and surface diffusion of a silicon (Si) element and a carbon (C) element in the inner walls of the trenches 6 occurs concurrently due to the hydrogen annealing at step S2.

As a result, silicon carbide is embedded at the corner portions of the bottoms of the trenches 6, whereby the corner portions of the bottoms of the trenches 6 are rounded. During the hydrogen annealing at step S2, surface regions of the inner walls of the trenches 6 become n-type regions. Therefore, in the inner walls of the trenches 6, n-type regions are formed at the surfaces of the p-type base regions 3. These n-type regions are places where leak current occurs during reverse bias of the silicon carbide semiconductor device 10 according to the first embodiment.

Therefore, a heat treatment is performed for a certain amount of time under a hydrogen atmosphere of a temperature of less than 1500 degrees C. and only the surface of the silicon carbide is etched (hydrogen etching: second heat treatment), whereby the n-type regions formed in the inner walls of the trenches 6 are removed (step S3: seventh process (step (7))). The hydrogen etching at step S3, for example, may be performed at a temperature in a range from 1300 degrees C. to less than 1500 degrees C. or may be performed at a temperature in a range from 1350 degrees C. to less than 1450 degrees C.

In particular, the hydrogen etching at step S3 is performed, for example, under a pressure of about 11 kPa for about 60 minutes at a temperature of about 1400 degrees C. In this manner, the hydrogen etching is performed at a temperature less than 1500 degrees C., whereby the crystal surface of the inner walls of the trenches 6 is etched while surface diffusion of the silicon and the carbon element at the crystal surface of the inner walls of the trenches 6 is suppressed. Therefore, a step is formed in the crystal surface of inner walls of the trenches 6, thereby planarizing the inner walls of the trenches 6.

In this manner, in the first embodiment, in the removal of the n-type regions that occur in the inner walls of the trenches 6 due to the hydrogen annealing at step S2, the inner walls of the trenches 6 are not thermally oxidized (step S103 in FIG. 19) like in the conventional method and therefore, excess carbon is not generated in the inner walls of the trenches 6. As a result, the n-type regions of the inner walls of the trenches 6 causing leak current may be removed without increasing channel resistance.

Figure 8:
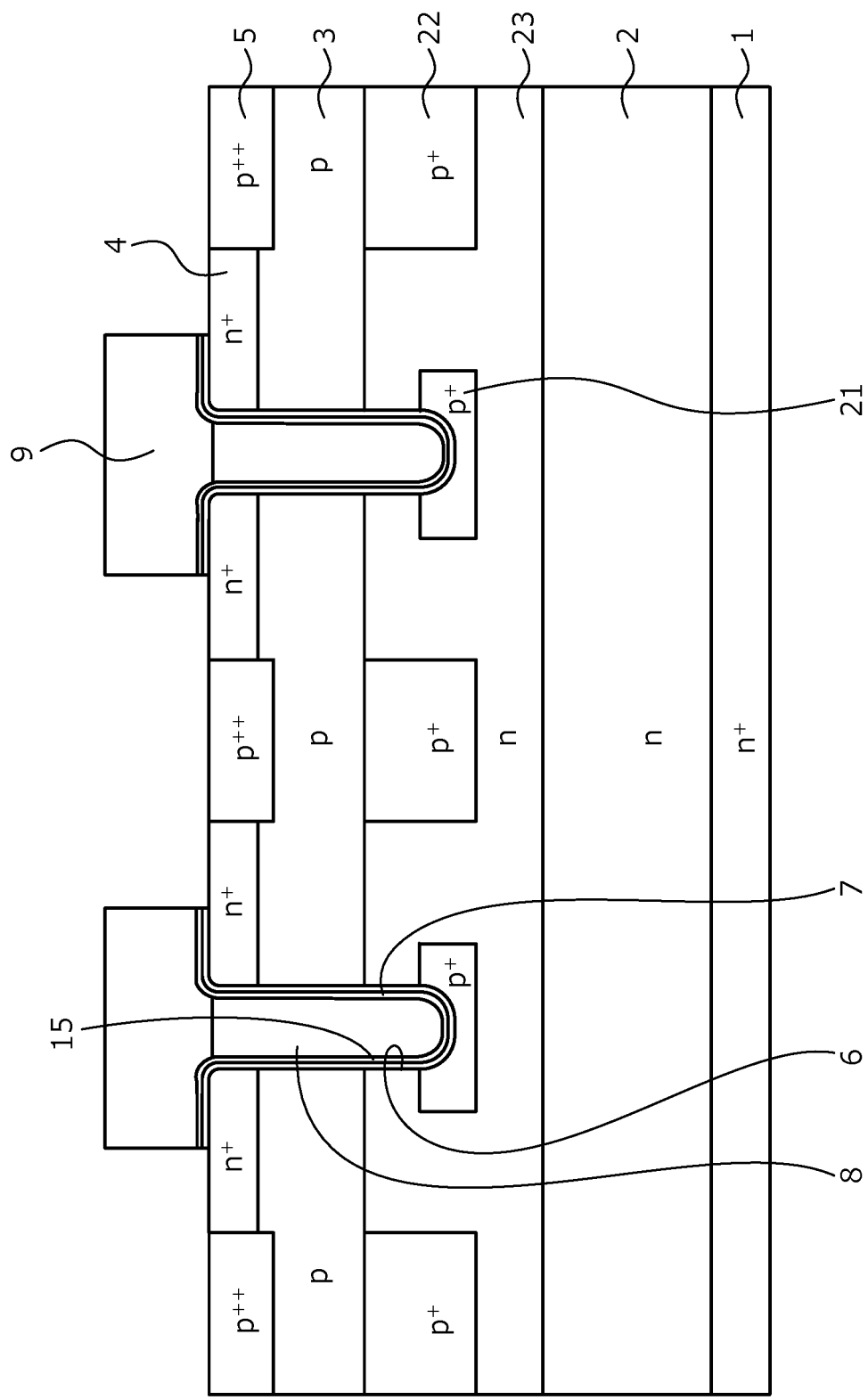
FIG. 8 is a cross-sectional view of a state of the silicon carbide semiconductor device according to the first embodiment during manufacture.

Next, the temperature of the heat treatment furnace into which the semiconductor substrate 30 has been placed is decreased to 700 degrees C. During the decrease in temperature, a gas containing nitrogen ($N_2$) is introduced into the heat treatment furnace, carbon atoms in the silicon carbide portions of the inner walls of the trenches 6 are replaced with nitrogen atoms, and the surfaces of silicon carbide portions (hereinafter, SiC surfaces) are nitrided, whereby, as depicted in FIG. 8, a silicon nitride (SiN) film 15 is formed along the inner walls of the trenches 6 (step S4: eighth process (step (8))). The SiN film 15 has a function similar to that of the gate insulating films 7. The process at steps S2 to S4 described above may be performed in the same heat treatment furnace.

Next, after the semiconductor substrate 30 is removed from the heat treatment furnace, the field oxide film (not depicted) is deposited on an entire area of the front surface of the semiconductor substrate 30 (step S5). The field oxide film, for example, is a TEOS film formed by plasma CVD. Next, by photolithography and etching, the field oxide film is selectively removed, whereby a portion corresponding to the active region is exposed at the front surface of the semiconductor substrate 30 (step S6). The inner walls of the trenches 6 are also exposed by the process at step S6.

Next, in an HTO furnace (second heat treatment), along the inner walls of the trenches 6, for example, an HTO film is deposited on the SiN film 15 as the gate insulating films 7 (step S7: ninth process (step (9))). Next, post deposition annealing (PDA) is performed under an atmosphere containing nitrogen (step S8: tenth process (step (10))). Before the gate insulating films 7 are formed, the inner walls (SiC surfaces) of the trenches 6 are nitrided and therefore, in the process at step S8, characteristics of the $SiO_2$/SiC interfaces 14 may be improved without excessively performing the PDA.

The PDA in the process at step S8, for example, is performed for a period in a range from about 10 minutes to 30 minutes at a temperature in a range from about 1100 degrees C. to 1300 degrees C. under a nitrogen ($N_2$) atmosphere containing about 10% nitric oxide (NO). Due to the PDA, the oxygen amount and the nitrogen amount of the interface section 14a may be in the respective ranges described above and channel mobility may be increased as compared to that by the conventional method (refer to FIG. 19), thereby enabling the channel resistance to be reduced.

Next, a polysilicon layer (not depicted) doped with an n-type impurity is deposited on the front surface of the semiconductor substrate 30 as to be embedded in the trenches 6. Next, the polysilicon layer is etched, leaving portions thereof only in the trenches 6 as the gate electrodes 8 (step S9: eleventh process (step (11))). The MOS gates are configured by the trenches 6, the gate insulating films 7, and the gate electrodes 8 formed by the processes at steps S1 to S9 described above.

Next, the interlayer insulating film 9 is formed on an entire area of the front surface of the semiconductor substrate 30. Next, by photolithography and etching, the interlayer insulating film 9 and the gate insulating films 7 are selectively removed to form contact holes to expose the $n^+$-type source regions 4 and the $p^{++}$-type contact regions 5. Next, the ohmic electrodes 11 are formed on the front surface of the semiconductor substrate 30, in the contact holes to be in ohmic contact with the $n^+$-type source regions 4 and the $p^{++}$-type contact regions 5.

An ohmic electrode (not depicted) is formed in ohmic contact with the back surface of the semiconductor substrate 30. The source electrode 12 is formed on the front surface of the semiconductor substrate 30 so as to be embedded in the contact holes and in ohmic contact with the ohmic electrodes 11. The drain electrode 13 is formed on the ohmic electrode on the back surface of the semiconductor substrate 30. Thereafter, the semiconductor wafer is diced (cut) into individual chips, whereby the silicon carbide semiconductor device 10 depicted in FIG. 1 is completed.

As described above, according to the first embodiment, the inner walls of the trenches are subjected to the hydrogen etching (etching by the heat treatment under the hydrogen atmosphere) before the gate insulating films are formed, thereby enabling the inner walls of the trenches to be planarized. Further, in an instance in which the inner walls of the trenches are subjected to the hydrogen annealing (the heat treatment under the hydrogen atmosphere to round the corner portions of the trenches) before the gate insulating films are formed, the n-type regions that occur in the trenches due to the hydrogen annealing and cause leak current may be removed by the hydrogen etching.

The inner walls of the trenches are planarized by the hydrogen etching, whereby silicon carbide surfaces having an orderly crystal structure appear at the inner walls of the trenches and as a result, the increase of the oxygen concentration ends at a position close to the start of decrease of the carbon concentration and therefore, a width of interface section in a direction from the silicon carbide portions of the trench inner wall toward the gate insulating film may be reduced. As a result, compared to the conventional method in which the hydrogen etching is not performed, the ratio that the interface section occupies in the channel is smaller, whereby increases of the channel resistance are suppressed, enabling the ON resistance to be reduced.

Further, the n-type regions that occur in the inner walls of the trenches due to the hydrogen annealing and cause leak current are removed by the hydrogen etching, whereby thermal oxidation (sacrificial oxidation) like that in the conventional method is unnecessary after the hydrogen annealing. Therefore, the excess carbon presumed to cause increases in the channel resistance at the inner walls of the trenches does not occur. Accordingly, leak current between the source and drain caused by the n-type regions formed in the inner walls of the trenches by the hydrogen annealing may be suppressed.

Further, according to the first embodiment, to nitride the surfaces of the silicon carbide portions of the inner walls of the trenches, a gas containing nitrogen is introduced into the heat treatment furnace during the decrease in temperature after the hydrogen etching, whereby between the HTO film forming the gate insulating films and silicon carbide portions of the inner walls of trenches, the SiN film functioning as a gate insulating film may be formed. Due to the SiN film, nitrogen may be introduced into the interface section and the oxygen amount and the nitrogen amount of the interface section may be set in the ranges described above without excessively performing the subsequent PDA. As a result, the channel resistance and the ON resistance may be reduced.

Figure 9:
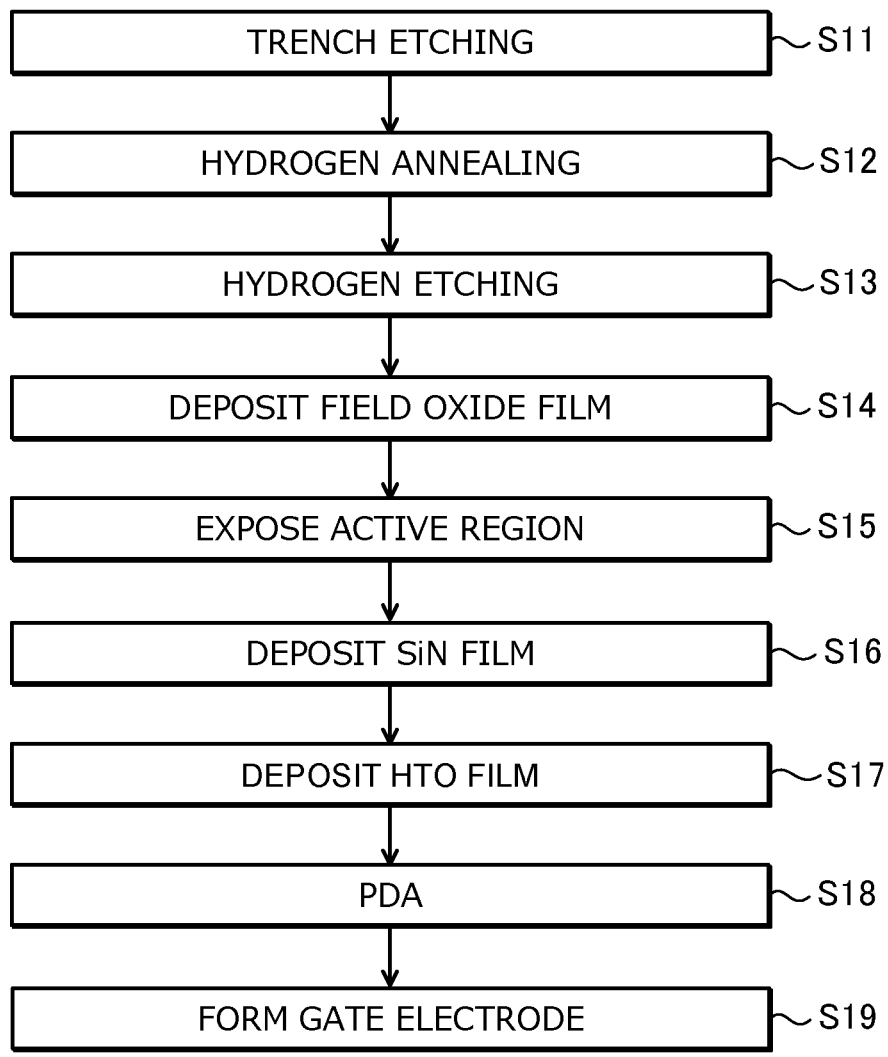
FIG. 9 is a flowchart of an outline of a method of manufacturing a silicon carbide semiconductor device according to a second embodiment.

Next, a method of manufacturing a silicon carbide semiconductor device according to a second embodiment will be described. FIG. 9 is a flowchart of an outline of the method of manufacturing the silicon carbide semiconductor device according to the second embodiment. In FIG. 9, only formation processes of the MOS gates are depicted. A structure of the silicon carbide semiconductor device according to the second embodiment is similar to the structure of the silicon carbide semiconductor device 10 according to the first embodiment (refer to FIG. 1).

The method of manufacturing the silicon carbide semiconductor device according to the second embodiment depicted in FIG. 9 differs from the method of manufacturing the silicon carbide semiconductor device 10 according to the first embodiment depicted in FIG. 2 in that instead of nitrification of the inner walls (SiC surfaces) of the trenches 6 (process at step S4 in FIG. 2), as a pretreatment before the gate insulating films 7 (HTO film) are formed on the inner walls of the trenches 6, a silicon nitride (SiN) film is deposited on the inner walls of the trenches 6 (process at step S16 in FIG. 9).

In particular, in the second embodiment, as depicted in FIG. 9, similarly to the first embodiment, processes of forming semiconductor regions in the semiconductor substrate 30 (not depicted), the trench etching (step S11: second process (step (2))), the hydrogen annealing (step S12: sixth process), the hydrogen etching (step S13: seventh process), deposition of a field oxide film (step S14), and selective removal of the field oxide film to expose the active region (step S15) are sequentially performed.

Next, as a source gas, silane ($SiH_4$) gas and nitrogen ($N_2$) gas are introduced into the HTO furnace used at subsequent step S17, and the SiN film 15 is deposited on the inner walls of the trenches 6 to have a thickness of, for example, at most 2 nm (step S16: eighth process). The SiN film 15 has a function similar to that of the gate insulating films 7. Next, a HTO film is deposited on the SiN film 15 as the gate insulating films 7 (step S17: eighth process), the PDA (step S18: tenth process) and subsequent processes are sequentially performed similarly to the first embodiment, whereby the silicon carbide semiconductor device 10 depicted in FIG. 1 is completed.

The SiN film 15 is deposited before the HTO film is formed on the inner walls of the trenches 6, whereby, subsequently, similarly to the first embodiment, characteristics of the $SiO_2$/SiC interfaces 14 may be improved without excessively performing the PDA. In the second embodiment, the processes at steps S11 to S15, S17, S18 and the formation of the gate electrodes 8 (step S19: eleventh process) are respectively performed under similar conditions and by similar methods as those for the processes at steps S1 to S3, S5, S6 to S9 in the first embodiment (refer to FIG. 2).

As described above, according to the second embodiment, the SiN film is deposited on the inner walls of the trenches before the HTO film (gate insulating film) is deposited, whereby nitrogen may be introduced into the interface section without excessively performing the PDA similarly to the first embodiment, thereby, enabling effects similar to those of the first embodiment to be obtained.

Figure 10:
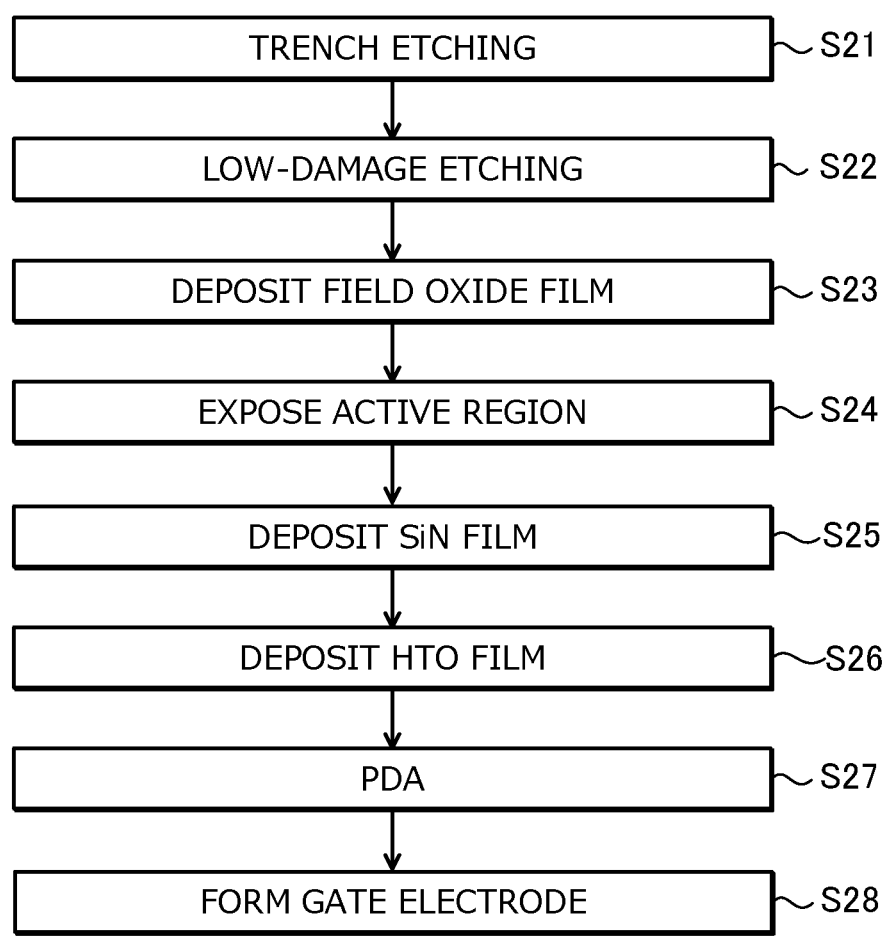
FIG. 10 is a flowchart of an outline a method of manufacturing a silicon carbide semiconductor device according to a third embodiment.

Next, a method of manufacturing a silicon carbide semiconductor device according to a third embodiment will be described. FIG. 10 is a flowchart of an outline the method of manufacturing the silicon carbide semiconductor device according to the third embodiment. In FIG. 10, only formation processes of the MOS gates are depicted. A structure of the silicon carbide semiconductor device according to the third embodiment is similar to the structure of the silicon carbide semiconductor device 10 according to the first embodiment (refer to FIG. 1).

The method of manufacturing the silicon carbide semiconductor device according to the third embodiment depicted in FIG. 10 differs from the method of manufacturing the silicon carbide semiconductor device according to the second embodiment depicted in FIG. 9 in that instead of the hydrogen annealing and the hydrogen etching (processes at steps S12, S13 in FIG. 9), the inner walls of the trenches 6 are etched by low-damage dry etching by radicals (hereinafter, low-damage etching), whereby the inner walls of the trenches 6 are planarized, similarly to the first embodiment (process at step S22 in FIG. 10).

In particular, in the third embodiment, as depicted in FIG. 10, similarly to the second embodiment, processes of forming semiconductor regions in the semiconductor substrate 30 (not depicted) and the trench etching (step S21: fifth process) are sequentially performed. Next, the inner walls of the trenches 6 are subjected to the low-damage etching (step S22: seventh process). Next, the deposition of the field oxide film (step S23) and subsequent processes are sequentially performed similarly to the second embodiment, whereby the silicon carbide semiconductor device 10 depicted in FIG. 1 is completed.

In the process at step S22, for example, the low-damage etching that causes highly reactive fluorine atoms (F radicals) generated under a plasma atmosphere of carbon tetrafluoride ($CF_4$) gas and silicon (Si) near the SiC surfaces to react and be exhausted as silicon tetrafluoride ($SiF_4$) having high vapor pressure becomes possible by using dry etching such as chemical dry etching (CDE) or plasma etching, etc. The generation of F radicals may be advanced by adding oxygen ($O_2$) gas to the $CF_4$ gas.

In the third embodiment, the processes at steps S21, S23, the process of selectively removing the field oxide film to expose the active region (step S24), the deposition of the SiN film 15 (step S25: eighth process), the deposition of the HTO film (step S26: ninth process), the PDA (step S27: tenth process), and the formation of the gate electrodes 8 (step S28: eleventh process) are respectively performed under similar conditions and by similar methods as those for the processes at steps S11, S14 to S19 in the second embodiment (refer to FIG. 9).

As described above, according to the third embodiment, the hydrogen annealing (process of rounding the trench bottoms) is not performed, whereby the n-type regions that cause leak current are not formed in the inner walls of the trenches, thereby enabling suppression of leak current between the source and drain. Further, according to the third embodiment, the hydrogen annealing is not performed and while the hydrogen etching is also not performed, instead of the hydrogen etching, the inner walls of the trenches are subjected to the low-damage etching, whereby the inner walls of the trenches may be planarized, thereby enabling the width of the interface section to be reduced, similarly to the first and the second embodiments.

Further, according to the third embodiment, the inner walls of the trenches are subjected to the low-damage etching instead of the hydrogen etching, whereby the inner walls of the trenches may be planarized and thus, thereafter, nitrogen may be introduced into the interface section by depositing the SiN film on the inner walls of the trenches before forming the HTO film (gate insulating film), without excessively performing the PDA, similarly to the first and the second embodiments. As a result, the oxygen amount and the nitrogen amount of the interface section are in the ranges described above and the channel resistance may be reduced, thereby enabling effects similar to those of the first and the second embodiments to be obtained.

Figure 11:
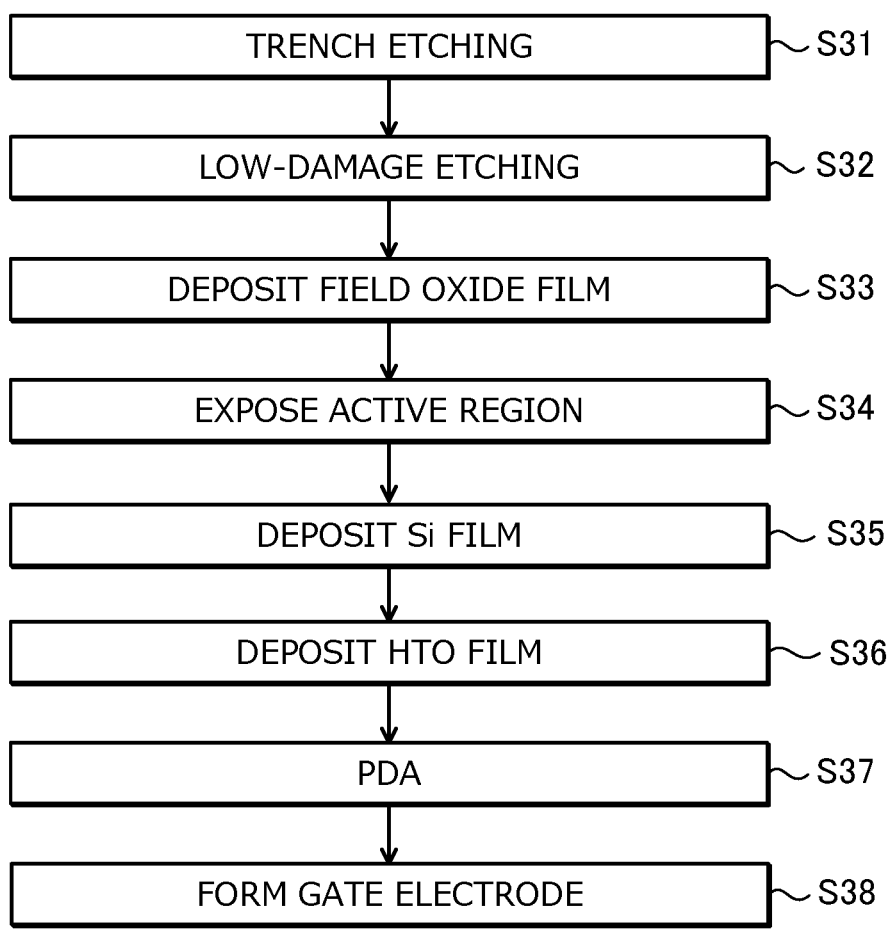
FIG. 11 is a flowchart of an outline of a method of manufacturing a silicon carbide semiconductor device according to a fourth embodiment.

Next, a method of manufacturing a silicon carbide semiconductor device according to a fourth embodiment will be described. FIG. 11 is a flowchart of an outline of the method of manufacturing the silicon carbide semiconductor device according to the fourth embodiment. In FIG. 11, only formation processes of the MOS gates are depicted. A structure of the silicon carbide semiconductor device according to the fourth embodiment is similar to the structure of the silicon carbide semiconductor device 10 according to the first embodiment (refer to FIG. 1).

The method of manufacturing the silicon carbide semiconductor device according to the fourth embodiment depicted in FIG. 11 differs from the method of manufacturing the silicon carbide semiconductor device according to the third embodiment depicted in FIG. 10 in that instead of the process of depositing the SiN film 15 (process at step S25 in FIG. 10), as a pretreatment before the formation of the HTO film (the gate insulating films 7) on the inner walls of the trenches 6, a silicon (Si) layer such as a polysilicon (poly-Si) layer is deposited on the inner walls of the trenches 6 (process at step S35 in FIG. 11).

In particular, in the fourth embodiment, as depicted in FIG. 11, from the processes of forming semiconductor regions in the semiconductor substrate 30 (not depicted), to the process of selectively removing the field oxide film to expose the active region (step S34) are sequentially performed similarly to the third embodiment. Next, as a source gas, silane gas is introduced into the HTO furnace used at subsequent step S36, and a Si film (not depicted) is deposited along the inner walls of the trenches 6 to have a thickness of, for example, at most 2 nm (step S35: eighth process).

Next, an HTO film is deposited on the Si film as the gate insulating films 7 (step S36: ninth process) and thereafter, the PDA (step S37: tenth process) and subsequent processes are sequentially performed similarly to the third embodiment. In the PDA (step S37), the Si film formed at step S35 is nitrided to become the SiN film 15. The SiN film 15 has a function similar to that of the gate insulating films 7. In this manner, the SiN film 15 is formed during the PDA and therefore, characteristics of the SiO$_2$/SiC interfaces 14 may be improved without excessively performing the PDA.

In the fourth embodiment, the trench etching (step S31: fifth process), the low-damage etching (step S32: seventh process), the deposition of the field oxide film (step S33), the processes at steps S34, S36, S37, and the formation of the gate electrodes 8 (step S38: eleventh process) are respectively performed under similar conditions and by similar methods as those for the processes at steps S21 to S24, S26 to S28 in the third embodiment (refer to FIG. 10). As a result, the silicon carbide semiconductor device 10 depicted in FIG. 1 is completed.

As described above, according to the fourth embodiment, similarly to the third embodiment, the hydrogen annealing (process of rounding the trench bottoms) is not performed and the inner walls of the trenches are subjected to the low-damage etching, whereby effects similar to those of the third embodiment may be obtained.

Further, according to the fourth embodiment, the Si film is deposited on the inner walls of the trenches before the HTO film (gate insulating film) is formed, whereby the Si film may be converted into the SiN film during the PDA without excessively performing the PDA and since nitrogen may be introduced into the interface section similarly to the first to the third embodiments, effects similar to the first to the third embodiments may be obtained.

Figure 12A:
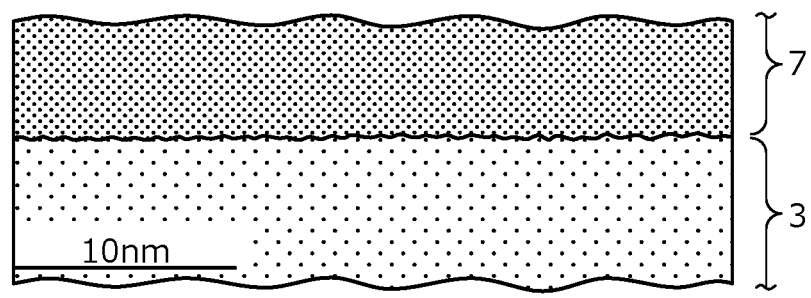
FIG. 12A is a diagram schematically depicting results of observation of a channel portion of a $SiO_2$/SiC interface in an example.
Figure 12B:
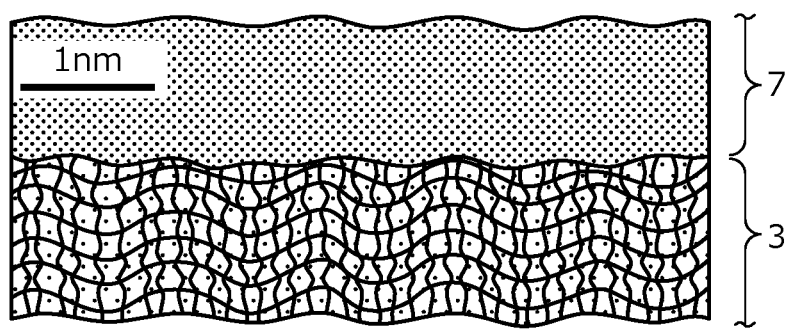
FIG. 12B is a diagram schematically depicting results of observation of a channel portion of a $SiO_2$/SiC interface in the example.
Figure 15:
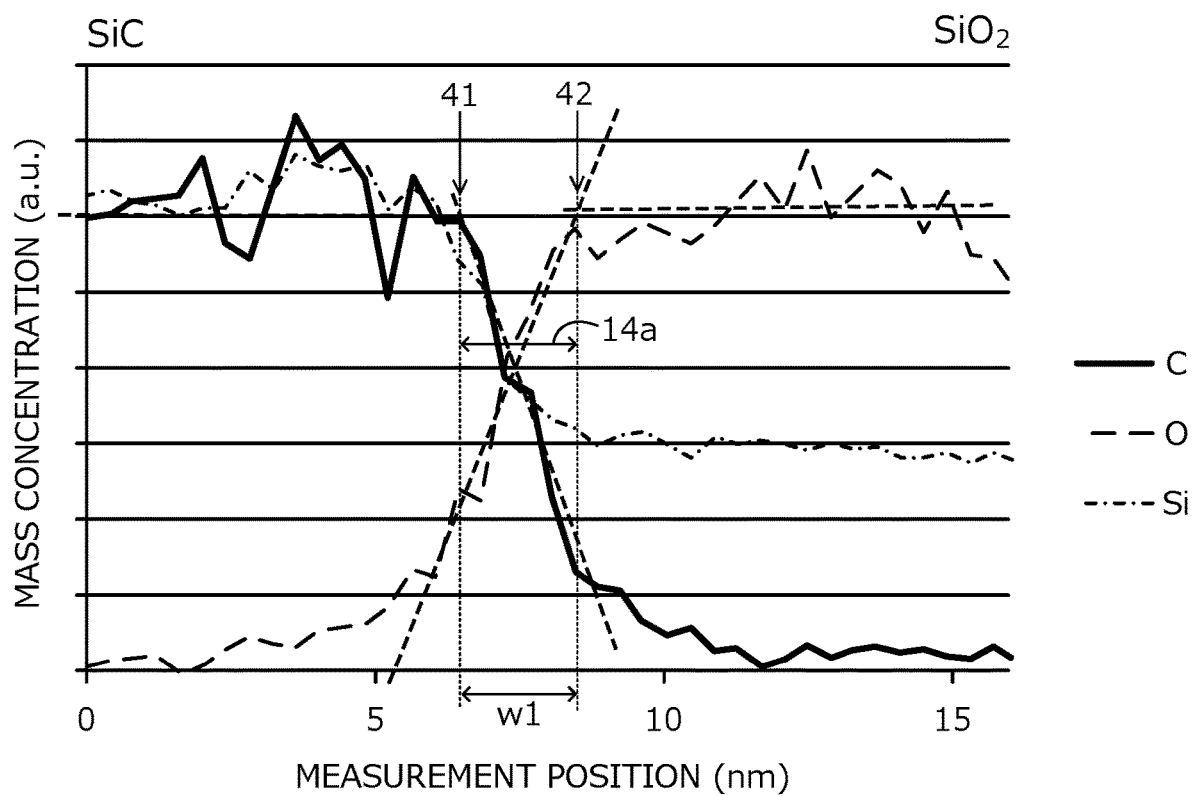
FIG. 15 is a characteristics diagram of element detection ratios near a channel in the example.
Figure 16:
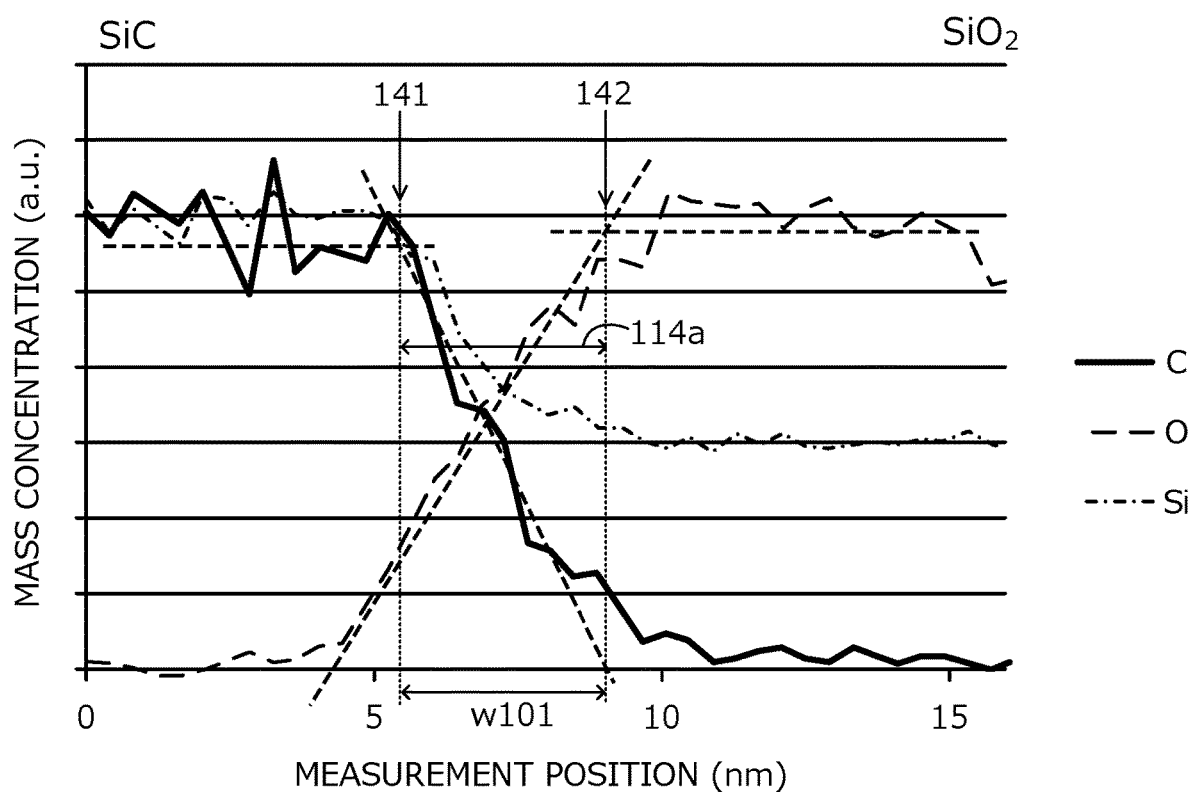
FIG. 16 is a characteristics diagram of element detection ratios near a channel in the first conventional example.
Figure 17:
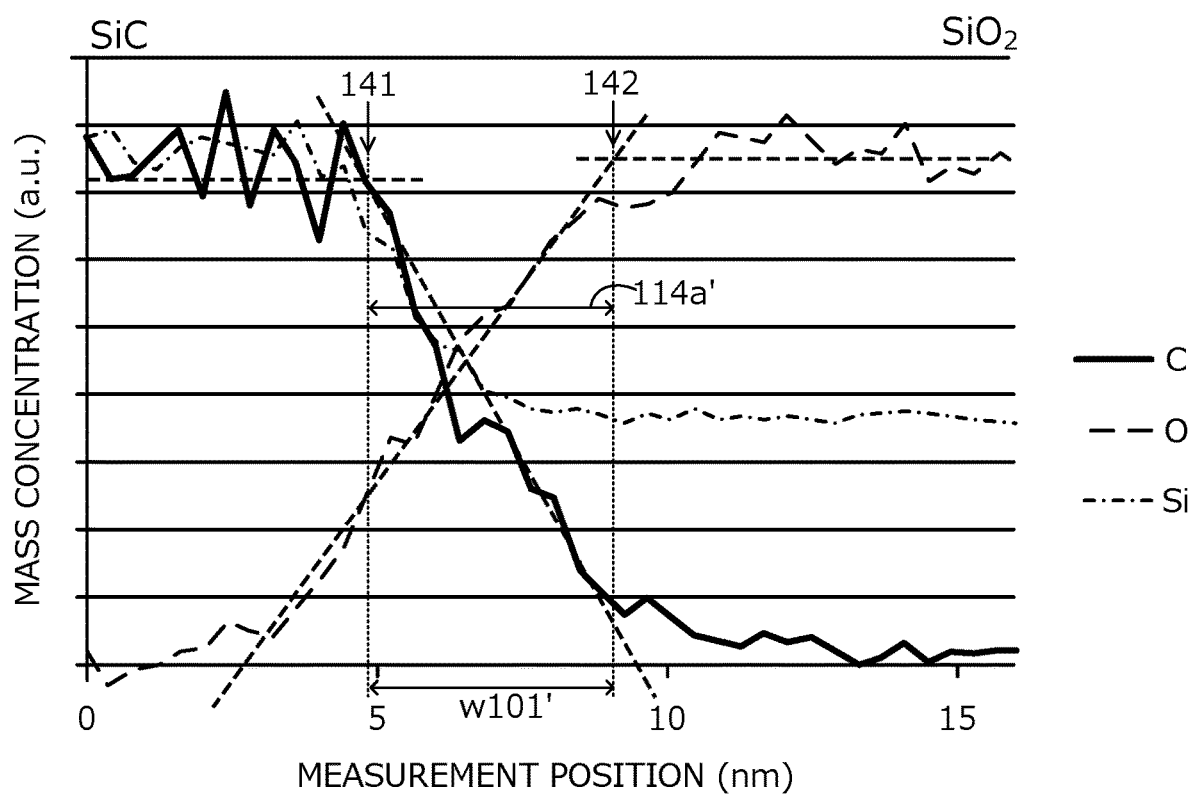
FIG. 17 is a characteristics diagram of element detection ratios near a channel in the second conventional example.

As an example, the width w1 of the interface section 14aa was verified. FIGS. 12A and 12B are diagrams schematically depicting results of observation of a channel portion of a SiO$_2$/SiC interface in the example. FIGS. 13A, 13B, 14A, and 14B are diagrams schematically depicting results of observation of channel portions of SiO$_2$/SiC interfaces in first and second conventional examples. FIG. 15 is a characteristics diagram of element detection ratios near a channel in the example. FIGS. 16 and 17 are characteristics diagrams of element detection ratios near a channel in the first and the second conventional examples.

Figure 13A:
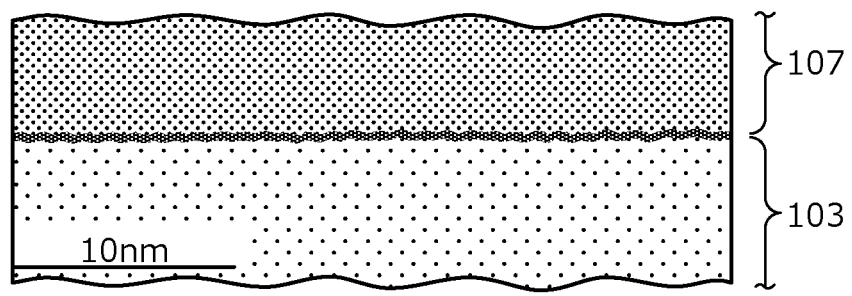
FIG. 13A is a diagram schematically depicting results of observation of a channel portion of a $SiO_2$/SiC interface in a first conventional example.
Figure 13B:
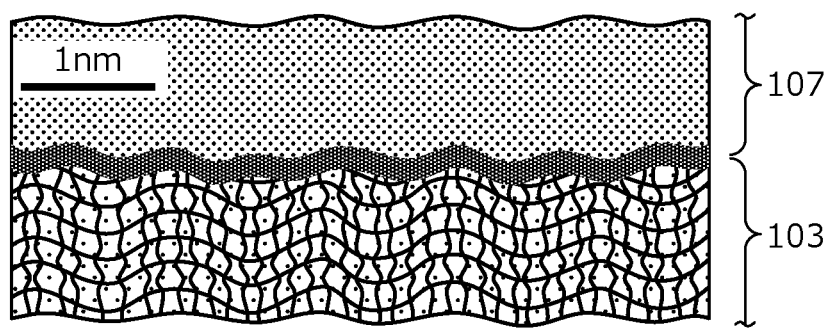
FIG. 13B is a diagram schematically depicting results of observation of a channel portion of a $SiO_2$/SiC interface in the first conventional example.
Figure 14A:
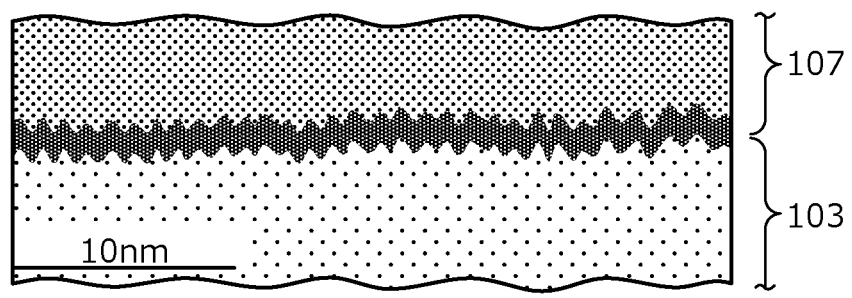
FIG. 14A is a diagram schematically depicting results of observation of a channel portion of a $SiO_2$/SiC interface in a second conventional example.
Figure 14B:
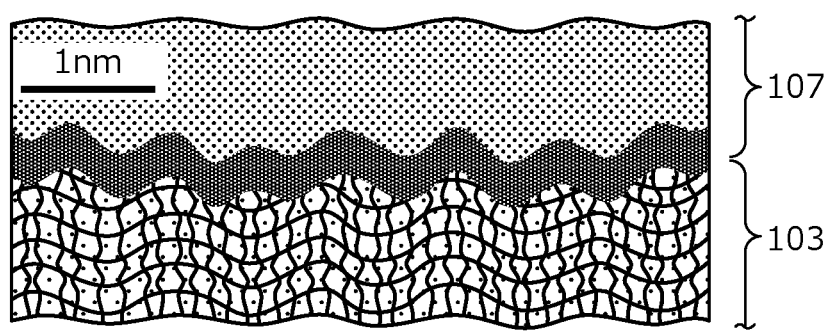
FIG. 14B is a diagram schematically depicting results of observation of a channel portion of a $SiO_2$/SiC interface in the second conventional example.

FIGS. 12A, 13A, and 14A are high angle annular dark field (HAADF) images obtained by scanning transmission electron microscopy (STEM). FIGS. 12B, 13B, and 14B are annular bright field (ABF) images obtained by STEM.

FIGS. 15 to 17 depict mass concentration profiles of a silicon element, an oxygen element, and a carbon element in the SiO$_2$/SiC interfaces obtained by energy dispersive x-ray spectrometry (EDX). In FIGS. 15 to 17, a horizontal axis indicates measurement position [nm] for the silicon carbide portions of the inner walls of the trenches 6 (left-hand side of figure) and for the gate insulating films 7 (right-hand side of figure). In FIGS. 15 to 17, a vertical axis indicates mass concentration in an arbitrary unit (a.u.).

Results of observing the channel 3a portions of the SiO$_2$/SiC interfaces 14 of a MOSFET (example) fabricated according to the method of manufacturing the silicon carbide semiconductor device 10 according to the first embodiment (refer to FIG. 2) are depicted in FIGS. 12A and 12B. For comparison, results of observing the channel 103a portion of the SiO$_2$/SiC interfaces 114 of MOSFETs (first and second conventional examples) fabricated according to the method of manufacturing the conventional silicon carbide semiconductor device 110 (refer to FIG. 19) are depicted in FIGS. 13A to 14B. In FIGS. 13A to 14B, a disordered state of the SiO$_2$/SiC interfaces 14 is indicated by a layer of heavy dotted hatching at the interface between the gate insulating film 107 and the p-type base region 103.

Mass concentration profiles of the silicon element, the oxygen element, and the carbon element of the SiO$_2$/SiC interfaces of the example and the first and the second conventional examples are depicted in FIGS. 15 to 17. The first and the second conventional examples differ from the example in that instead of steps S3, S4 of the example, the thermal oxidation (step S103) is performed and the treatment time of the PDA (step S107) is longer than that for the example. The second conventional example differs from the first conventional example in that the film thickness (thickness) of the thermal oxidation (step S103) is two times greater.

From the results depicted in FIGS. 12A to 17, it was confirmed that compared to the first and the second conventional examples, in the example, the SiO$_2$/SiC interfaces 14 could be planarized (refer to FIGS. 12A to 14B) and the width w1 of the interface section 14a could be reduced (refer to FIGS. 15 to 17). For the example and the first and the second conventional examples, three samples of each were prepared and calculated average values of the widths w1, w101, and w101' of the interface sections 14a, 114a, 114a' were as follows.

For the width w1 of the interface section 14a of the three samples of the example, values measured from an angle of 30 degrees with respect to a direction orthogonal to the $SiO_2$/SiC interfaces 14 (the first direction X, refer to FIG. 1) were 2.1 nm, 2.2 nm, and 3.2 nm, respectively. The average value of the values measured from the angle of 30 degrees with respect to a direction orthogonal to the $SiO_2$/SiC interfaces 14 was 2.5 nm and a corrected value obtained by projecting the average value on a plane parallel to the $SiO_2$/SiC interfaces 14 was 1.25 nm (=2.5 nm/2).

An upper limit of the width w1 of the interface section 14a of the example may be obtained from the greatest value 3.2 nm of the values measured for the three samples of the example. In other words, a corrected value of 1.6 nm (=3.2 nm/2) obtained by projecting the greatest value 3.2 nm of the values measured for the three samples of the example on a plane parallel to the $SiO_2$/SiC interfaces 14 is the upper limit of the width w1 of the interface section 14a. Therefore, the described effects of the example are obtained when the width w1 of the interface section 14a is at most 1.6 nm.

For the width w101 of the interface section 114a of the three samples of the first conventional example, values measured from an angle of 30 degrees with respect to a direction orthogonal to the $SiO_2$/SiC interfaces 114 were 3.5 nm, 3.9 nm, and 4.4 nm, respectively. The average value of the values measured from the angle of 30 degrees with respect to a direction orthogonal to the $SiO_2$/SiC interfaces 114 was about 3.9 nm and a corrected value obtained by projecting the average value on a plane parallel to the $SiO_2$/SiC interfaces 114 was 1.95 nm (=3.95 nm/2).

For the width w101' of the interface section 114a' of the three samples of the second conventional example, values measured from an angle of 30 degrees with respect to a direction orthogonal to the $SiO_2$/SiC interfaces 114 were 4.2 nm, 4.7 nm, and 4.8 nm, respectively. The average value of the values measured from the angle of 30 degrees with respect to a direction orthogonal to the $SiO_2$/SiC interfaces 114 was about 4.6 nm and a corrected value obtained by projecting the average value on a plane parallel to the $SiO_2$/SiC interfaces 114 was 2.3 nm (=4.6 nm/2).

In the example, a reason that the width w1 of the interface section 14a is narrower than that in the first and the second conventional examples is as follows. As depicted in FIGS. 15 to 17, compared to the first and the second conventional examples, in the example, the inner walls of the trenches 6 are planarized by the hydrogen etching, whereby silicon carbide surfaces having an orderly crystal structure appear at the inner walls of the trenches 6. Therefore, compared to the first and the second conventional examples, a rate of decrease of the carbon concentration (negative slope of the carbon concentration profile) becomes steep for the interface section 14a in a direction from the silicon carbide portions of the inner walls of the trenches 6 toward the gate insulating films 7 (the first direction X, refer to FIG. 1).

Further, in this manner, in the example, in the interface section 14a, the rate of decrease of the carbon concentration becomes steep, whereby as compared to the first and the second conventional examples, a rate of increase of the oxygen concentration (positive slope of the oxygen concentration profile) also becomes steep for the interface section 14a in a direction from the silicon carbide portions of the inner walls of the trenches 6 toward the gate insulating films 7. As a result, for the interface section 14a in a direction from the silicon carbide portions of the inner walls of the trenches 6 toward the gate insulating films 7, the increase of the oxygen concentration ends (the end 42 of increase of the oxygen concentration) at a position close to the start 41 of decrease of the carbon concentration.

In the carbon concentration profile, the start 41 of decrease of the carbon concentration is an intersection of a primary line (dashed line parallel to the horizontal axis) that is an approximation of a section of the carbon concentration profile in which the carbon concentration does not vary and a primary line (dashed diagonal line along the carbon concentration profile) of the rate of decrease (negative slope of the carbon concentration profile) of the carbon concentration of the interface section 14a. A start 141 of decrease of the carbon concentrations depicted in FIGS. 16 and 17 is defined similarly to the start 41 of decrease of the carbon concentration in FIG. 15.

In the oxygen concentration profile, the end 42 of increase of the oxygen concentration is an intersection of a primary line (dashed line parallel to the horizontal axis) that is an approximation of a section of the oxygen concentration profile in which the oxygen concentration does not vary and a primary line (dashed diagonal line along the oxygen concentration profile) of the rate of increase (positive slope of the oxygen concentration profile) of the oxygen concentration of the interface section 14a. An end 142 of increase of the oxygen concentration depicted in FIGS. 16 and 17 is defined similarly to the end 42 of increase of the oxygen concentration in FIG. 15.

As an experimental example, the oxygen amount and the nitrogen amount of the interface section 14a were verified. FIG. 18 is a table of the oxygen amount and the nitrogen amount of an interface section of the experimental example. Steps S1 to S7 (processes from the trench etching to the formation of the gate insulating films 7) were performed sequentially according to the method of manufacturing the silicon carbide semiconductor device according to the first embodiment described above (refer to FIG. 2) to fabricate and prepare multiple samples. Results of performing the PDA (process at step S8) under different conditions (including not performing the PDA) for each of the samples are depicted in FIG. 18.

The oxygen amount and the nitrogen amount of the interface section 14a of each of the samples of the experimental example were measured using electron spectroscopy for chemical analysis (ESCA) after the gate insulating films 7 were removed by buffered hydrofluoric acid (BHF) and the inner walls (the $SiO_2$/SiC interfaces 14) of the trenches 6 were exposed. An analysis depth of the ESCA was a dozen or so nm from sidewalls of the trenches 6 in a direction orthogonal to the sidewalls (the first direction X, refer to FIG. 1).

From the results depicted in FIG. 18, variation of the oxygen amount and the nitrogen amount of the interface section 14a due to the conditions of the PDA (process at step S8) was confirmed. Further, it was confirmed that for the atmosphere of the PDA, a nitrogen atmosphere (90% $N_2$+10% NO) containing about 10% nitric oxide is advantageous and when the oxygen amount and the nitrogen amount of the interface section 14a are within the ranges described above, channel mobility increases and the ON resistance may be reduced.

On the other hand, in an instance in which the PDA was not performed (no PDA), an instance in which the atmosphere of the PDA was a nitrogen atmosphere (100% $N_2$), and an instance in which the temperature of the PDA atmosphere was low (at most 1100 degrees C.), the oxygen amount and the nitrogen amount of the interface section 14*a* were outside the ranges described above, channel mobility was small, and the ON resistance could not be reduced. In FIG. 18, a symbol "⊚" and a symbol "○" are samples for which channel mobility was large and the ON resistance could be reduced; in particular, the symbol "⊚" is the best sample. A symbol "x" is a sample for which channel mobility was small and the ON resistance could not be reduced.

While not depicted, in instances in which nitrogen is introduced into the $SiO_2$/SiC interfaces 14 by the method of manufacturing the silicon carbide semiconductor devices according to the second to the fourth embodiments, effects similar to those of the samples indicated by the symbol "⊚" and the symbol "○" of the experimental example and the example may be obtained.

In the foregoing, the present invention is not limited to the embodiments described above and various modifications within a range not departing from the spirit of the invention are possible. For example, instead of the process at step S4 (nitriding of the SiC surfaces) of the first embodiment (refer to FIG. 2), the process at step S35 (deposition of the Si film) of the fourth embodiment (refer to FIG. 11) may be performed after the process at step S6 (exposure of the active region) but before the process at step S7 (deposition of the HTO film). Alternatively, instead of the process at step S35 (deposition of the Si film) of the fourth embodiment (refer to FIG. 11), a heat treatment (third heat treatment) for the process at step S4 (nitriding of the SiC surfaces) of the first embodiment (refer to FIG. 2) may be performed after the process at step S32 (low-damage etching) but before the process at step S33 (deposition of the field oxide film).

According to the invention described above, the n-type regions that cause leak current are removed from the inner walls of the trenches by etching or the n-type regions that cause leak current do not occur in the inner walls of the trenches. Further, according to the invention described above, the oxygen amount and the nitrogen amount of the interface section are set to predetermined amounts, whereby increases of the channel resistance may be suppressed. The width of the interface section is reduced, whereby increases of the channel resistance may be further suppressed.

The silicon carbide semiconductor device and method of manufacturing a silicon carbide semiconductor device according to the present invention achieve an effect in that leak current may be suppressed and the ON resistance may be reduced.

As described above, the silicon carbide semiconductor device and the method of manufacturing a silicon carbide semiconductor device according to the present invention are useful for power semiconductor devices used in power converting equipment and in power source devices such as for various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
  a semiconductor substrate containing silicon carbide and having a first main surface and a second main surface opposite to one another;
  a first semiconductor region of a first conductivity type, provided in the semiconductor substrate;
  a plurality of second semiconductor regions of a second conductivity type, provided between the first main surface of the semiconductor substrate and the first semiconductor region;
  a plurality of third semiconductor regions of the first conductivity type, provided between the first main surface of the semiconductor substrate and the second semiconductor regions;
  a plurality of trenches penetrating the third semiconductor regions and the second semiconductor regions and reaching the first semiconductor region;
  a plurality of gate insulating films provided along inner walls of the trenches;
  a plurality of gate electrodes provided on the gate insulating films on the inner walls of the trenches;
  a first electrode electrically connected to the third semiconductor regions and the second semiconductor regions; and
  a second electrode provided on the second main surface of the semiconductor substrate, wherein
  each interface between one of the gate insulating films and a corresponding one of the second semiconductor regions has an interface section in which an oxygen concentration varies, the interface section having an oxygen amount that is in a range from $1.3 \times 10^{15}/cm^2$ to $1.6 \times 10^{15}/cm^2$, and
  the interface section has a nitrogen amount that is greater than $5.0 \times 10^{14}/cm^2$.

2. The silicon carbide semiconductor device according to claim 1, wherein
  the interface section has a width that is at most 1.6 nm.

3. A method of manufacturing the silicon carbide semiconductor device of claim 1, the method comprising:
  (1) preparing a starting substrate of a first conductivity type and containing silicon carbide;
  (2) forming a first-conductivity-type silicon carbide layer on the starting substrate, the first-conductivity-type silicon carbide layer having an impurity concentration lower than an impurity concentration of the starting substrate, the first-conductivity-type silicon carbide layer constituting a first semiconductor region of the first conductivity type;
  (3) forming a second-conductivity-type silicon carbide layer on the first-conductivity-type silicon carbide layer, the second-conductivity-type silicon carbide layer constituting a plurality of second semiconductor regions of a second conductivity type;
  (4) selectively forming a plurality of third semiconductor regions of the first conductivity type, in surface regions of the second-conductivity-type silicon carbide layer;
  (5) forming a plurality of trenches that penetrate the third semiconductor regions and the second semiconductor regions and reach the first semiconductor region;
  (6) after the step (5), rounding corner portions of the trenches by a first heat treatment under a hydrogen atmosphere of a temperature of at least 1500 degrees C.;
  (7) after the step (6), planarizing inner walls of the trenches and exposing silicon carbide surfaces having an orderly crystal structure by etching the inner walls of the trenches;
  (8) forming a thin film containing silicon, along the planarized inner walls of the trenches;
  (9) depositing an oxide film on the thin film along the inner walls of the trenches, the oxide film constituting a plurality of gate insulating films;

(10) improving interface characteristics between the gate insulating films and silicon carbide portions of the inner walls of the trenches by performing a post deposition annealing treatment under an atmosphere containing nitric oxide and nitrogen; and

(11) forming a plurality of gate electrodes on the gate insulating films in the trenches, wherein each interface between one of the gate insulating films and a corresponding one of the second semiconductor regions has an interface section in which an oxygen concentration varies, an oxygen amount of the interface section being at most $1.6 \times 10^{15}/cm^2$, the step (8) includes depositing a silicon nitride film or converting the thin film into a silicon nitride film, the interface section thereby having a nitrogen amount greater than $5.0 \times 10^{14}/cm^2$, and the step (7) includes etching and planarizing the inner walls of the trenches by a second heat treatment under a hydrogen atmosphere of a temperature less than 1500 degrees C.

4. The method according to claim 3, wherein the step (6) of rounding the corner portions, the step (7) of planarizing the inner walls, and the step (8) of forming the thin film are successively performed using a same first heat treatment furnace.

5. The method according to claim 3, wherein the step (8) includes nitriding the silicon carbide surfaces of the inner walls of the trenches by introducing a gas containing nitrogen while the temperature of the second heat treatment decreases, to form the silicon nitride film as the thin film.

6. The method according to claim 3, wherein the step (8) includes introducing a silane gas and a nitrogen gas as a source gas into a second heat treatment furnace used in depositing the oxide film on the thin film, to deposit the silicon nitride film as the thin film.

7. The method according to claim 3, wherein the step (8) includes introducing a silane gas as a source gas into a second heat treatment furnace used in depositing the oxide film on the thin film, to deposit a silicon film as the thin film and the step (10) includes nitriding the thin film to convert the thin film into the silicon nitride film by performing the post deposition annealing treatment.

8. The method according to claim 3, wherein the step (7) includes etching the inner walls of the trenches for the interface section to have a width that is at most 1.6 nm.

9. The method according to claim 3, wherein a temperature of the post deposition annealing treatment in the step (10) is in a range from 1100 degrees C. to 1300 degrees C.

10. The method according to claim 3, wherein a treatment time of the post deposition annealing treatment in the step (10) is in a range from 10 minutes to 30 minutes.

11. A method of manufacturing the silicon carbide semiconductor device of claim 1, the method comprising:

(1) preparing a starting substrate of a first conductivity type and containing silicon carbide;

(2) forming a first-conductivity-type silicon carbide layer on the starting substrate, the first-conductivity-type silicon carbide layer having an impurity concentration lower than an impurity concentration of the starting substrate, the first-conductivity-type silicon carbide layer constituting a first semiconductor region of the first conductivity type;

(3) forming a second-conductivity-type silicon carbide layer on the first-conductivity-type silicon carbide layer, the second-conductivity-type silicon carbide layer constituting a plurality of second semiconductor regions of a second conductivity type;

(4) selectively forming a plurality of third semiconductor regions of the first conductivity type, in surface regions of the second-conductivity-type silicon carbide layer;

(5) forming a plurality of trenches that penetrate the third semiconductor regions and the second semiconductor regions and reach the first semiconductor region;

(6) after the step (5), rounding corner portions of the trenches by a first heat treatment under a hydrogen atmosphere of a temperature of at least 1500 degrees C., (7) after the step (6), planarizing inner walls of the trenches and exposing silicon carbide surfaces having an orderly crystal structure by etching the inner walls of the trenches;

(8) forming a thin film containing silicon, along the planarized inner walls of the trenches;

(9) depositing an oxide film on the thin film along the inner walls of the trenches, the oxide film constituting a plurality of gate insulating films;

(10) improving interface characteristics between the gate insulating films and silicon carbide portions of the inner walls of the trenches by performing a post deposition annealing treatment under an atmosphere containing nitric oxide and nitrogen; and

(11) forming a plurality of gate electrodes on the gate insulating films in the trenches, wherein the post deposition annealing treatment in the step (10) is performed at a temperature in a range from 1100 degrees C. to 1300 degrees C. for a treatment time in a range from 10 minutes to 30 minutes, and the step (7) includes etching and planarizing the inner walls of the trenches by a second heat treatment under a hydrogen atmosphere of a temperature less than 1500 degrees C.

* * * * *